(12) United States Patent
Hennessy et al.

(10) Patent No.: US 8,604,330 B1
(45) Date of Patent: Dec. 10, 2013

(54) HIGH-EFFICIENCY SOLAR-CELL ARRAYS WITH INTEGRATED DEVICES AND METHODS FOR FORMING THEM

(75) Inventors: John J. Hennessy, Cambridge, MA (US); Andrew C. Malonis, Somerville, MA (US); Arthur J. Pitera, Chestnut Hill, MA (US); Eugene A. Fitzgerald, Windham, NH (US); Steven A. Ringel, Bexley, OH (US)

(73) Assignee: 4Power, LLC, Salem, NH (US)

( * ) Notice: Subject to any disclaimer, the term of this patent is extended or adjusted under 35 U.S.C. 154(b) by 57 days.

(21) Appl. No.: 13/310,856

(22) Filed: Dec. 5, 2011

Related U.S. Application Data

(60) Provisional application No. 61/420,180, filed on Dec. 6, 2010, provisional application No. 61/495,635, filed on Jun. 10, 2011.

(51) Int. Cl.
*H01L 35/34* (2006.01)
*H01L 21/00* (2006.01)

(52) U.S. Cl.
USPC .......... 136/201; 136/206; 136/239; 136/261; 438/74

(58) Field of Classification Search
USPC ......... 136/201, 206, 233, 239, 244, 252, 261; 438/73–74, 96–97
See application file for complete search history.

(56) References Cited

U.S. PATENT DOCUMENTS

| | | |
|---|---|---|
| 3,657,613 A | 4/1972 | Brody et al. |
| 3,679,949 A | 7/1972 | Uekusa et al. |
| 3,965,279 A | 6/1976 | Levinstein et al. |
| 4,078,944 A | 3/1978 | Mlavsky |
| 4,105,471 A | 8/1978 | Yerkes et al. |
| 4,180,414 A | 12/1979 | Diamond et al. |
| 4,255,212 A | 3/1981 | Chappell et al. |
| 4,278,704 A | 7/1981 | Williams |
| 4,283,589 A | 8/1981 | Kaplow et al. |
| 4,323,719 A | 4/1982 | Green |
| 4,370,510 A | 1/1983 | Stirn |
| 4,492,813 A | 1/1985 | Kausche et al. |

(Continued)

FOREIGN PATENT DOCUMENTS

| | | |
|---|---|---|
| EP | 1833099 | 4/2008 |
| EP | 1914808 | 4/2008 |

(Continued)

OTHER PUBLICATIONS

Bandopadhyay et al., "Nickel silicide contact for silicon solar cells," *Bull. Mater. Sci.*, vol. 15:5, (Oct. 1992) pp. 473-479.

(Continued)

*Primary Examiner* — Susan D Leong
(74) *Attorney, Agent, or Firm* — Bingham McCutchen LLP

(57) ABSTRACT

In various embodiments, an array of discrete solar cells with associated devices such as bypass diodes is formed over a single substrate. In one instance, a method of forming a solar-cell array with integrated bypass diodes comprising: providing a semiconductor substrate, a first cell comprising a SiGe p-n junction or SiGe p-i-n junction, one or more second cells each comprising a III-V semiconductor p-n junction or III-V semiconductor p-i-n junction; forming a bypass diode that is discrete and laterally separate from its associated solar cell and comprises an unremoved portion of the first cell, the formation comprising removing an unremoved portion of the one or more second cells thereover.

19 Claims, 28 Drawing Sheets

(56) References Cited

U.S. PATENT DOCUMENTS

| | | | |
|---|---|---|---|
| 4,521,952 A | 6/1985 | Riseman |
| 4,577,051 A | 3/1986 | Hartman |
| 4,582,952 A | 4/1986 | McNeely et al. |
| 4,612,408 A | 9/1986 | Moddel et al. |
| 4,657,628 A | 4/1987 | Holloway et al. |
| 4,728,370 A | 3/1988 | Ishii et al. |
| 4,757,030 A | 7/1988 | Galvin et al. |
| 4,759,803 A | 7/1988 | Cohen |
| 4,765,845 A | 8/1988 | Takada et al. |
| 4,782,377 A | 11/1988 | Mahan |
| 4,907,052 A | 3/1990 | Takada et al. |
| 4,933,022 A | 6/1990 | Swanson |
| 5,057,439 A | 10/1991 | Swanson et al. |
| 5,116,427 A | 5/1992 | Fan et al. |
| 5,131,954 A | 7/1992 | Vogeli et al. |
| 5,151,385 A | 9/1992 | Yamamoto et al. |
| 5,164,019 A | 11/1992 | Sinton |
| 5,248,346 A | 9/1993 | Fraas et al. |
| 5,451,529 A | 9/1995 | Hsu et al. |
| 5,616,185 A | 4/1997 | Kukulka |
| 5,811,335 A | 9/1998 | Santangelo et al. |
| 5,944,913 A | 8/1999 | Hou et al. |
| 5,990,415 A | 11/1999 | Green et al. |
| 6,013,870 A | 1/2000 | Psyk et al. |
| 6,034,322 A | 3/2000 | Pollard |
| 6,039,803 A | 3/2000 | Fitzgerald et al. |
| 6,262,358 B1 | 7/2001 | Kamimura et al. |
| 6,274,804 B1 | 8/2001 | Psyk et al. |
| 6,278,054 B1 | 8/2001 | Ho et al. |
| 6,310,281 B1 | 10/2001 | Wendt et al. |
| 6,316,715 B1 | 11/2001 | King et al. |
| 6,340,788 B1 | 1/2002 | King et al. |
| 6,350,944 B1 | 2/2002 | Sherif et al. |
| 6,452,086 B1 | 9/2002 | Muller |
| 6,476,313 B2 | 11/2002 | Kawano |
| 6,552,259 B1 | 4/2003 | Hosomi et al. |
| 6,559,043 B1 | 5/2003 | Tseng et al. |
| 6,635,507 B1 | 10/2003 | Boutros et al. |
| 6,635,817 B2 | 10/2003 | Chang |
| 6,696,739 B2 | 2/2004 | Lee et al. |
| 6,784,358 B2 | 8/2004 | Kukulka |
| 6,864,414 B2 | 3/2005 | Sharps et al. |
| 6,881,893 B1 | 4/2005 | Cobert |
| 6,903,261 B2 | 6/2005 | Habraken et al. |
| 6,963,024 B2 | 11/2005 | Ojima et al. |
| 6,967,278 B2 | 11/2005 | Hatsukaiwa et al. |
| RE38,988 E | 2/2006 | Dinwoodie |
| 7,081,584 B2 | 7/2006 | Mook |
| 7,115,811 B2 | 10/2006 | Ho et al. |
| 7,119,271 B2 | 10/2006 | King et al. |
| 7,122,398 B1 | 10/2006 | Pichler |
| 7,122,734 B2 | 10/2006 | Fetzer et al. |
| 7,126,052 B2 | 10/2006 | Fetzer et al. |
| 7,189,917 B2 | 3/2007 | Okada et al. |
| 7,259,322 B2 | 8/2007 | Gronet |
| 7,301,095 B2 | 11/2007 | Murphy et al. |
| 7,339,108 B2 | 3/2008 | Tur et al. |
| 7,351,993 B2 | 4/2008 | Atanackovic |
| 7,480,990 B2 | 1/2009 | Fitzsimmons et al. |
| 7,659,474 B2 | 2/2010 | Joslin et al. |
| 7,687,707 B2 | 3/2010 | Meck et al. |
| 7,727,792 B2 | 6/2010 | Kurosu |
| 7,732,706 B1 | 6/2010 | Mardesich |
| 7,759,158 B2 | 7/2010 | Bachrach et al. |
| 2002/0058366 A1 | 5/2002 | Miyasaki et al. |
| 2002/0068396 A1 | 6/2002 | Fitzergald |
| 2002/0164834 A1* | 11/2002 | Boutros et al. .......... 438/59 |
| 2003/0070707 A1 | 4/2003 | King et al. |
| 2004/0163698 A1 | 8/2004 | Sharps et al. |
| 2004/0200523 A1 | 10/2004 | King et al. |
| 2004/0259334 A1 | 12/2004 | Bedell et al. |
| 2005/0155641 A1 | 7/2005 | Fafard |
| 2005/0217717 A1 | 10/2005 | Faris |
| 2005/0285098 A1 | 12/2005 | Fathimulla et al. |
| 2006/0021565 A1 | 2/2006 | Zahler et al. |
| 2006/0112986 A1 | 6/2006 | Atwater et al. |
| 2006/0185582 A1 | 8/2006 | Atwater et al. |
| 2007/0113884 A1 | 5/2007 | Kinsey et al. |
| 2007/0277869 A1 | 12/2007 | Shan et al. |
| 2007/0277874 A1 | 12/2007 | Dawson-Elli et al. |
| 2008/0092943 A1 | 4/2008 | Comfeld et al. |
| 2008/0128019 A1 | 6/2008 | Lopatin et al. |
| 2008/0135089 A1 | 6/2008 | Tsakalakos et al. |
| 2008/0178924 A1 | 7/2008 | Kempa et al. |
| 2008/0257405 A1 | 10/2008 | Sharps |
| 2009/0025778 A1 | 1/2009 | Rubin et al. |
| 2009/0056809 A1 | 3/2009 | Chen |
| 2009/0065047 A1 | 3/2009 | Fiorenza et al. |
| 2009/0188554 A1 | 7/2009 | Aiken |
| 2009/0255577 A1 | 10/2009 | Tischler |
| 2009/0272427 A1 | 11/2009 | Bett et al. |
| 2009/0272438 A1 | 11/2009 | Cornfeld |
| 2009/0314348 A1 | 12/2009 | McGlynn et al. |
| 2010/0089441 A1 | 4/2010 | Frolov et al. |
| 2010/0096001 A1 | 4/2010 | Sivananthan et al. |
| 2010/0108130 A1 | 5/2010 | Ravi |
| 2010/0116329 A1 | 5/2010 | Fitzgerald et al. |
| 2010/0116942 A1 | 5/2010 | Fitzgerald et al. |
| 2010/0275969 A1 | 11/2010 | Chan et al. |
| 2010/0313935 A1 | 12/2010 | Coakley et al. |
| 2011/0124146 A1 | 5/2011 | Pitera et al. |
| 2011/0132445 A1 | 6/2011 | Pitera et al. |
| 2011/0143495 A1 | 6/2011 | Pitera et al. |

FOREIGN PATENT DOCUMENTS

| | | |
|---|---|---|
| EP | 2083452 | 7/2009 |
| EP | 2226850 | 9/2010 |
| GB | 1440458 | 6/1976 |
| WO | WO-2006/123938 | 11/2006 |
| WO | WO-2007/053686 | 5/2007 |
| WO | WO-2007/106180 | 9/2007 |
| WO | WO-2008/108990 | 9/2008 |
| WO | WO-2009/099943 | 8/2009 |
| WO | WO-2009/151979 | 12/2009 |
| WO | WO-2010/033813 | 3/2010 |
| WO | WO-2010/042981 | 4/2010 |
| WO | WO-2010/075606 | 7/2010 |
| WO | WO-2010/102345 | 9/2010 |

OTHER PUBLICATIONS

Carlin et al., "High efficiency GaAs-on-Si solar cells with high $V_{oc}$ using graded GeSi buffers," Photovoltaic Specialists Conference, 2000, Conference Record of the Twenty-Eighth IEEE, pp. 1006-1011.

Currie et al., "Controlling threading dislocation densities in Ge on Si using graded SiGe layers and chemical-mechanical polishing," *Applied Physics Letters* vol. 72: 14 (Apr. 6, 1998) pp. 1718-1720.

Defense Advanced Research Projects Agency Vulture Program, Broad Agency Announcement (BAA) Solicitation 07-51, Jul. 31, 2007.

Kim et al., "Low-Cost Contact Formation of High-Efficiency Crystalline Silicon Solar Cells by Plating," *Jrl. Korean Phys. Soc.*, vol. 46:5 (May 2005) pp. 1208-1212.

Reinhardt et al., "Solar-Powered Unmanned Aerial Vehicles," Proceedings of the 31st Intersociety Energy Conversion Engineering Conference, vol. 1, pp. 41-46 (Aug. 1996).

Ringel et al., "Anti-phase domain-free GaAs on Ge substrates grown by molecular beam epitaxy for space solar cell applications," Photovoltaic Specialists Conference, 1997, Conference Record of the Twenty-Sixth IEEE, pp. 793-798.

Said et al., "High quality, relaxed SiGe epitaxial layers for solar cell application," *Thin Solid Films*, 337 (1999) 85-89.

Sieg et al., "High minority-carrier lifetimes in GaAs grown on low-defect-density Ge/GeSi/Si substrates," *Applied Physics Letters*, vol. 73:21 (Nov. 23, 1998) pp. 3111-3113.

Usami et al., "SiGe bulk crystal as a lattice-matched substrate to GaAs for solar cell applications," *Applied Physics Letters*, vol. 77: 22 (Nov. 27, 2000).

(56) References Cited

OTHER PUBLICATIONS

Venkatasubramanian, et al., "High Quality GaAs on Si using $Si_{0.04}Ge_{0.96}$/Ge buffer layers," *Jr. of Crys. Growth*, 107 (1991) pp. 489-493.

Venkatasubramanian et al., "Development of low-bandgap Ge and $Si_{0.07}Ge_{0.93}$ solar cells for monolithic and mechanically-stacked cascade applications", Conference Record of the Twenty First IEEE Photovoltaic Specialists Conference, 73-8, vol. 1 (1990).

Geisz, J. et al, "III-V/Silicon Lattice-Matched Tandem Solar Cells" National Renewable Energy Laboratory, Conference Paper, NREL/CP-520-36991, Jan. 2005 (4 pages).

Partial International Search Report for PCT/US2009/045596, dated Dec. 30, 2009, 6 pages.

International Search Report and Written Opinion for PCT/US2009/045596 dated Mar. 12, 2010, 15 pages.

R.M. Sieg et al, "Toward device-quality GaAs growth by molecular beam epitaxy on offcut $Ge/Si_{1-x}Ge_x$/Si substrates," J. Vac. Sci. Technol. B 16(3), May/Jun. 1998, 4 pages.

S.A. Ringel, et al., "III-V Space Solar Cells on Si Substrates Using Graded GeSi Buffers," 16th European PVSECE—Glasgow, Scotland 2000, 6 pages.

S. A. Ringel, et al., "Toward Achieving Efficient III-V Space Cells on Ge/GeSi/Si Wafers," Poc. 2nd World Conference and Exhibition on photovoltaic solar energy conversion, Vienna, Jul. 1998, 6 pages.

E.A. Fitzgerald et al., "The Science and Applications of Relaxed Semiconductor Alloys on Conventional Substrates," 3rd World Conference on Photovoltaic Energy Conversion May 11-18, 2003, Osaka, Japan, pp. 587-592.

J.A. Carlin et al., "High-lifetime GaAs on Si using GeSi buffers and its potential for space photovoltaics," Solar Energy Materials & Solar Cells 66 (2001), pp. 621-630.

C.L. Andre et al., "Impact of Threading Dislocations on Both n/p and p/n Single Junction GaAs Cells Grown on Ge/SiGe/Si Substrates," Conference Record of the 29th Photovoltaic Specialists Conference (2002), pp. 1043-1046.

Carrie L. Andre et al., "Investigations of High-Performance GaAs Solar Cells Grown on $Ge-Si1-xGEx$-Si Substrates," IEEE Transactions on Electron Devices, vol. 52, No. 6, Jun. 2005, pp. 1055-1060.

C. L. Andre et al., "Low-temperature GaAs films grown on Ge and Ge/SiGe/Si substrates," Journal of Applied Physics vol. 94, No. 8, Oct. 15, 2003, pp. 4980-4985.

S.A. Ringel, Optimized III-V Multijunction concentrator Solar Cells on Patterned Si and Ge Substrates, National Renewable Energy Laboratory, Subcontract Report NREL/SR-520-44250, Nov. 2008, 12 pages.

C. L. Andre et al., "Impact of dislocations on minority carrier electron and hole lifetimes in GaAs grown on metamorphic SiGe substrates," Applied Physics Letters vol. 84, No. 18, May 3, 2004, pp. 3447-3449.

M. R. Lueck et al., "Dual Junction GaInP/GaAs Solar Cells Grown on Metamorphic SiGe/Si Substrates With High Open Circuit Voltage," IEEE Electron Device Letters, vol. 27, No. 3, Mar. 2006, pp. 142-144.

Matthias E. Nell et al., "The Spectral p-n Junction Model for Tandem Solar-Cell Design," IEEE Transactions on Electron Devices, vol. ED-34, No. 2, Feb. 1987, pp. 257-266.

David M. Isaacson et al., "Deviations from ideal nucleation-limited relaxation in high Ge content compositionally graded SiGe/Si," J. Vac. Sci. Technol. B 24(6), Nov./Dec. 2006, pp. 2741-2747.

C. L. Andre et al., "Impact of dislocation densities on $n+/p$ and $p+/n$ junction GaAs diodes and solar cells on SiGe virtual substrates," Journal of Applied Physics 98, 014502 (2005), 5 pages.

M. Gonzalez et al., "Deep level defects in proton radiated GaAs grown on metamorphic SiGe/Si substrates," Journal of Applied Physics 100, 034503 (2006), 7 pages.

Steven A. Ringel et al., "Multi-Junction III-V Photovoltaics on Lattice-Engineered Si Sustrates," Conference Record of the 31st Photovoltaic Specialists Conference (Jan. 2005), pp. 567-570.

David M. Wilt et al., "Preliminary On-Orbit Performance Data From GaAs on Si Solar Cells Aboard Misse5," Conference Record of the 4th World Conference on Photovoltaic Energy Conversion (May 2006), pp. 1915-1918.

Steven A. Ringel et al., "III-V Multi-Junction Materials and Solar Cells on Engineered SiGe/Si Substrates," Mater. Res. Soc. Symp. Proc. vol. 836 (2005) Materials Research Society, pp. L6.2.1-L6.2.12.

David M. Isaacson et al., "Mid-$10^5$ cm-$^2$ threading dislocation density in optimized high-Ge content relaxed graded SiGe on Si for III-V solar on Si," Mater. Res. Soc. Symp. Proc. vol. 836 (2005) Materials Research Society, pp. L6.5.1-L6.5.6.

T. Zdanowicz et al., "Theoretical analysis of the optimum energy band gap of semiconductors for fabrication of solar cells for applications in higher latitudes locations," Solar Energy Material & Solar Cells 87 (2005) pp. 757-769.

Matthew R. Lueck, B.S., "Impact of Annealing and Flux Ratio on MBE Grown GaInP Materials and Solar Cells," Thesis, The Ohio State University 2005, 98 pages.

Carrie L. Andre, B.S., M.S.E.E., "III-V Semiconductors on SiGe Substrates for Multi-Junction Photovoltaics," Dissertation, The Ohio State University (2004) 359 pages.

John Anthony Carlin, M.S.E.E., "Investigation and Development of High Quality GaAs-ON-Si for Space Photovoltaics Using a Graded GeSi Buffer," Dissertation, The Ohio State University (2001) 256 pages.

Jain et al. "Influence of the Dislocation Density on the Performance of Heteroepitaxial Indium Phosphide Solar Cells," IEEE Transactions on Electron Devices, vol. 40, No. 11 (Nov. 1993), pp. 1928-1937.

Hwang et al., "High Photo to Dark Current Ratio in SiGe/Si Schottky Barrier Photodetectors by Using an a-Si:H Cap Layer," IEEE Transactions on Electronic Devices, vol. 54, No. 9, pp. 2386-2391 (Sep. 2007).

Ringel et al. "Single-junction InGa/GaAs Solar Cells Grown on Si Substrates with SiGe Buffer Layers," Progress in Photovoltaics: Research and Applications, pp. 417-426 (2002).

Esram et al., "Comparison of Photovoltaic Array Maximum Power Point Tracking Techniques," IEEE Transactions on Energy Conversion, vol. 22, No. 2, pp. 439-449 (2007).

Esram et al., "Dynamic Maximum Power Point Tracking of Photovoltaic Arrays Using Ripple Correlation Control," IEEE Transactions on Power Electronics, vol. 21, No. 5, pp. 1282-1291 (2006).

Boehringer, "Self-Adapting dc Converter for Solar Spacecraft Power Supply," IEEE Transactions on Aerospace and Electronic Systems, vol. AES-4, No. 1, pp. 102-111 (1968).

Nguyen et al., "An Adaptive Solar Photovoltaic Array Using Model-Based Reconfiguration Algorithm," IEEE Transactions on Industrial Electronics, vol. 55, No. 7, pp. 2644-2654 (2008).

* cited by examiner

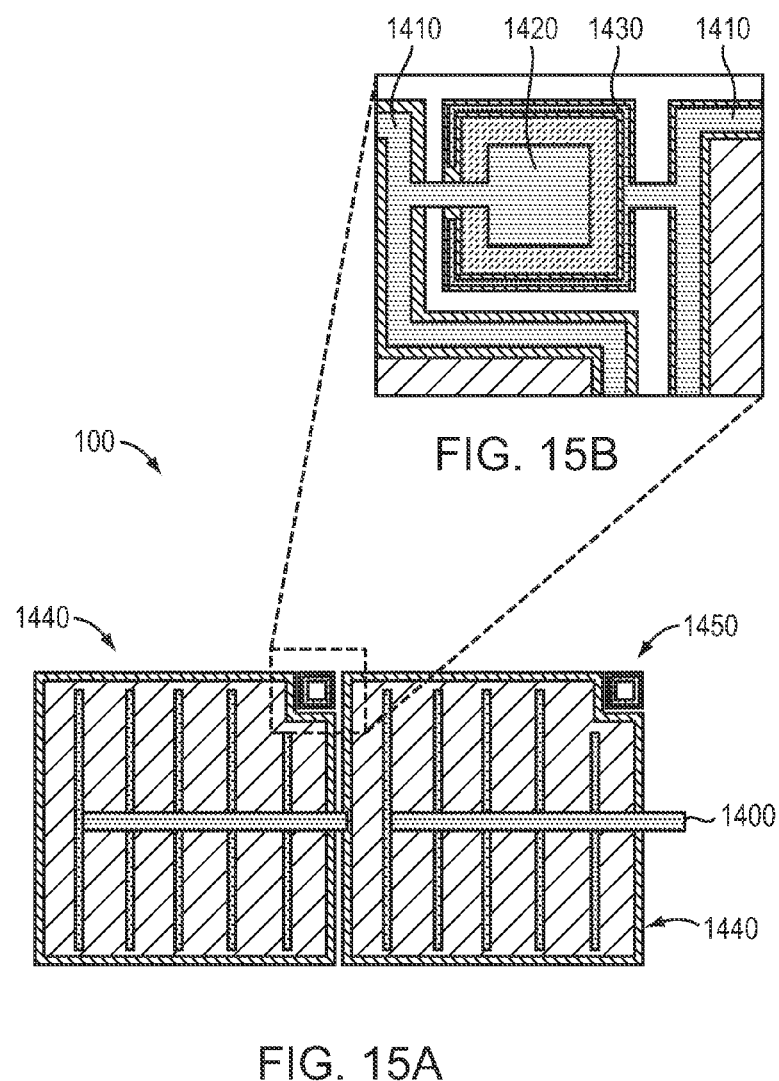

| BYPASS DIODE AREA / CELL AREA | PEAK POWER REDUCTION |
|---|---|
| NO BYPASS DIODES | 44.7% |
| 1 | 11.7% |
| 1/10 | 12.1% |
| 1/100 | 14.4% |

FIG. 17

HIGH-EFFICIENCY SOLAR-CELL ARRAYS WITH INTEGRATED DEVICES AND METHODS FOR FORMING THEM

RELATED APPLICATIONS

This application claims the benefit of and priority to U.S. Provisional Patent Application No. 61/420,180, filed Dec. 6, 2010, and U.S. Provisional Patent Application No. 61/495,635, filed Jun. 10, 2011, the entire disclosure of each of which is hereby incorporated herein by reference.

TECHNICAL FIELD

The present invention relates, in various embodiments, to the construction and fabrication of high-efficiency solar-cell arrays.

BACKGROUND

Semiconductor solar cells generally produce a light-generated output voltage that is roughly proportional to the equivalent bandgap of the material systems used to fabricate the solar cell. Under illumination, this output voltage typically ranges from less than one volt for low-efficiency single junction cells to nearly three volts for high-efficiency multi junction cells. In order to deliver a larger voltage to a load, cells are typically connected in series, whereupon the total output voltage becomes equal to the voltage of a single cell multiplied by the number of series-connected cells. The series connection of cells generally requires that the cells each operate at an identical current. With precise cell matching and uniform illumination over the large-area panel, this condition is often not restrictive. However, in situations where the photo-current of a single cell is reduced relative to the other cells in the string, all cells become limited to that reduced photo-current. This reduction in photo-current may result from physical damage, partial shading of the incident light, systematic variations in cell performance, or a localized temperature change in a particular cell. In extreme cases, the current reduction may lead to large reverse biases forming across the limiting cell, which in turn may lead to localized overheating and permanent physical damage. In order to prevent this particular failure mechanism, the use of discrete bypass diodes wired across individual cells or groups of cells in series is often employed. Bypass diodes help prevent the formation of large reverse biases and enable the non-limiting cells to operate closer to their optimal power output.

In conventional solar-panel designs the individual cells are manufactured from large-area semiconductor substrates (or large pieces thereof), typically 8 cm×8 cm pieces or larger. For applications requiring high-voltage operation, the series connection of many of these large-area cells results in an array string that occupies a much larger physical area (i.e., roughly equivalent to the sum of the areas of the individual cells). Because of the large area required, the string becomes more susceptible to partial shading that may significantly reduce the total output power of panel (as discussed above). Similarly, because the total power of the panel is generally proportional to the total area, large-area arrays are particularly susceptible to physical damage. In the worst case, physical damage to a single cell may shut down the entire series-connected string. Additionally, in situations where large temperature gradients exist over areas on the order of the size of the string (in solar-powered aircraft, for example) the performance of the entire string may become limited by the cells producing the least current. Lastly, because the entire semiconductor substrate is typically used in the fabrication of conventional solar panels, the addition of bypass diodes and other circuitry is generally performed with external discrete components. This increases the complexity and cost of the final panel assembly, as well as the total panel weight, any or all of which may represent critical design parameters, depending on the application.

SUMMARY

Embodiments of the invention feature high-efficiency SiGe- and/or III-V-based multi junction solar cells fabricated in series strings on a single substrate (e.g., a silicon substrate), as well as devices such as integrated bypass diodes (one for each one or more cells) on that substrate. Integrated electronics (e.g., silicon-based electronics) to perform voltage regulation and/or peak-power tracking may also be fabricated on the substrate, thereby forming what is herein termed a "smart-tile solar-panel-on-wafer," or simply a "solar-panel-on-wafer." The use of small-area cells (i.e., cells each having an area substantially less than that of the substrate on which they are fabricated, e.g., between approximately 2 mm×2 mm and approximately 1 cm×1 cm) connected in series on-wafer provides several critical advantages over conventional high-voltage solar panels. The small-area unit cells produce the same voltage (with less current) as the large-area cells used in a conventional panel. High voltages may be obtained by simply tiling the unit cell across the substrate using standard silicon processing techniques. The desired current may then be obtained by parallel connections of the solar-panel-on-wafer. Because the series-connected cells are confined to a smaller area than in conventional panels, they are less susceptible to large-area variations in shading and temperature. In other words, because more strings of series-connected cells are utilized to obtain the same power as provided by a conventional panel, partial shading or temperature gradients affect a smaller percentage of the total number of strings. Additionally, because the panel contains a much larger number of unit cells, the redundancy critical to avoiding or mitigating cell failures is increased. For example, any cell failure resulting in an open-circuit condition (e.g., from punctures, cracks, etc.) may deactivate a single string of cells, but because the panel-on-wafer uses more high-voltage strings to obtain a particular total panel power, the impact of that failure on the total power will be far less (as all remaining strings of cells remain operational).

In accordance with various embodiments of the invention, one or more, or even all, of the various cells fabricated on the common substrate have interconnects therebetween that are reconfigurable. For example, the cells may be dynamically reconfigured into different series- and/or parallel-connected groups in response to localized damage and/or shading, conditions that have the potential to impact more cells (e.g., up to one or more entire series-connected strings) than are actually directly impacted.

Solar cells and/or subcells in accordance with embodiments of the present invention may incorporate SiGe- and/or III-V-based active junctions "encapsulated" by silicon, i.e., multi junction solar cells produced on silicon substrates and having silicon-based capping layers. These may be produced utilizing techniques similar to those disclosed in U.S. Ser. No. 12/474,798, filed May 29, 2009 (the '798 application), U.S. Ser. No. 12/474,877, filed May 29, 2009 (the '877 application), U.S. Serial No. 12/790,078, filed May 28, 2010 (the '078 application), and U.S. Ser. No. 12/790,089, filed May 28, 2010 (the '089 application), the entire disclosure of each of which is incorporated by reference herein. Silicon encapsulation not only enables the fabrication of optimized junctions on larger, lower-density substrates, but also allows the solar cells to be fabricated in silicon-dedicated facilities.

In an aspect, embodiments of the invention feature a method of forming a solar-cell array with integrated bypass diodes. A structure including or consisting essentially of (i) a semiconductor substrate, (ii) a first cell disposed over the substrate, and (iii) one or more second cells disposed over the first cell is provided (e.g., by epitaxial deposition and/or wafer bonding). A plurality of discrete solar cells is formed over the top surface of the substrate at least in part by removing portions of the first cell and the one or more second cells to form the discrete solar cells and regions therebetween that do not produce electrical current under solar illumination. Each of the discrete solar cells is a multi-junction solar cell incorporating, in series, an unremoved portion of the first cell and an unremoved portion of the one or more second cells. A bypass diode associated with each of the discrete solar cells is formed. Each bypass diode is discrete and laterally separate from its associated solar cell and includes or consists essentially of an unremoved portion of the first cell, the formation of each bypass diode including or consisting essentially of removing an unremoved portion of the one or more second cells thereover. Each bypass diode is electrically connected with its associated discrete solar cell such that the bypass diode and the discrete solar cell have opposite polarities. A plurality of the discrete solar cells (or even all of them) is electrically connected in series on the substrate, thereby forming a series string of discrete solar cells for supplying, under solar illumination, a voltage larger than a voltage produced by any of the discrete solar cells individually.

Embodiments of the invention incorporate one or more of the following features in any of a variety of combinations. The first cell may include or consist essentially of a SiGe p-n junction or SiGe p-i-n junction. Each of the one or more second cells may include or consist essentially of a III-V-semiconductor p-n junction or III-V-semiconductor p-i-n junction. The bandgap of the first cell may be smaller than those of the one or more second cells, and the bandgaps of the second cells may increase with increasing distance away from the substrate. An isolation diode may be disposed beneath the first cell. The isolation diode may include or consist essentially of a p-n junction or a p-i-n junction having a polarity opposite the polarity of the first cell. The isolation diode may include or consist essentially of SiGe, InGaP, and/or InAlP, and it may have a bandgap smaller than the bandgap of the first cell. A graded-composition layer may be disposed beneath the first cell, and the graded-composition layer may relieve at least a portion of the lattice-mismatch strain between the substrate and the first cell. A first portion of the graded-composition layer may include or consist essentially of SiGe and may be disposed between the substrate and the isolation diode. A second portion of the graded-composition layer may include or consist essentially of SiGe and may be disposed between the isolation diode and the first cell. The first portion may grade from an initial Ge content to an intermediate Ge content larger than the initial Ge content. The second portion may grade from approximately the intermediate Ge content to a final Ge content larger than the intermediate content. A constant-composition SiGe layer may be disposed between the first and second portions of the graded-composition layer. The constant-composition layer may have a Ge content approximately equal to the intermediate Ge content.

A cap layer including or consisting essentially of doped or undoped silicon may be disposed over the one or more second cells. Forming the plurality of discrete solar cells may include, for each solar cell, forming a first contact to the cap layer and forming a second contact to a layer disposed beneath the first cell, each of the first and second contacts being formed over the top surface of the substrate. Forming the first and second contacts may include substantially simultaneously reacting a metal with a portion of the cap layer and a portion of the layer disposed beneath the first cell. The first contact may include or consist essentially of a silicide of the metal. The second contact may include or consist essentially of a germanosilicide of the metal. Forming the bypass diodes may include, for each bypass diode, forming a first contact to a top surface of the first cell and a second contact to a layer disposed beneath the first cell, each of the first and second contacts being formed over the top surface of the substrate. Forming the first and second contacts of each bypass diode may include substantially simultaneously reacting a metal with a portion of the first cell and a portion of the layer disposed beneath the first cell. Each of the first and second contacts of each bypass diode may include or consist essentially of a germanosilicide of the metal. The first contact of the bypass diode may cover substantially all of the top surface of the first cell of the bypass diode, thereby substantially preventing solar illumination thereof. The formation of the contacts of the discrete solar cells may be performed substantially simultaneously with the formation of the contacts of the bypass diodes.

At least one additional series string of discrete solar cells may be formed on the substrate. The series string and the at least one additional series string may be electrically connected, e.g., in parallel. Forming the series string may include forming interconnection circuitry on the substrate between each of the plurality of discrete solar cells. The interconnection circuitry may be formed, at least in part, over regions of the substrate lacking the first cell and one or more second cells (and thus may be formed after removal of portions of the first cell and one or more second cells in such regions). The interconnection circuitry between at least two of the discrete solar cells may include or consist essentially of a switching element enabling reconfiguration (e.g., connection or disconnection) of the electrical connection between the at least two discrete solar cells. The interconnection circuitry between each of the discrete solar cells may include or consist essentially of a switching element enabling reconfiguration of all of the electrical connections between the discrete solar cells. The interconnection circuitry may be electrically connected to a processor (e.g., a microcontroller, digital signal processor, microprocessor, etc.) for controlling the reconfiguration of the electrical connections between discrete solar cells. The processor may be formed on (e.g., over the top surface of) the substrate. Circuitry for maximum power-point tracking may be formed on (e.g., over the top surface of) the substrate and may be electrically connected to the series string. The circuitry may include a DC/DC converter. The circuitry may be electrically connected to a charge-storage element not disposed over the top surface of the substrate. The charge-storage element may be disposed under a bottom surface of the substrate opposite the top surface.

In another aspect, embodiments of the invention feature a solar-cell array with integrated bypass diodes that includes or consists essentially of a substrate, a plurality of discrete solar cells disposed over the substrate, and a plurality of bypass diodes disposed over the substrate. The plurality of discrete solar cells is electrically connected in series to form a series string of discrete solar cells for supplying, under solar illumination, a voltage larger than the voltage produced by any of the discrete solar cells individually. Each of the discrete solar cells comprises a first cell and, disposed thereover, one or more second cells. The first cell may include or consist essentially of a SiGe p-n junction or SiGe p-i-n junction. Each of the one or more second cells may include or consist essentially of a III-V-semiconductor p-n junction or III-V-semiconductor p-i-n junction. The bandgap of the first cell may be smaller than those of the one or more second cells, and the bandgaps of the second cells may increase with increasing distance away from the substrate. Each bypass diode is associated with one or more discrete solar cells (and each bypass diode may even be associated with a different discrete solar cell), is discrete and laterally separate from its associated solar cell(s), and includes or consists essentially of the first cell without the one or more second cells thereover. Each bypass diode is electrically connected with its associated solar cell(s) such that the bypass diode and the discrete solar cell(s) have opposite polarities.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 15A and 15B are, respectively, a plan view and an expanded partial plan view of a solar cell array with integrated devices in accordance with various embodiments of the invention;

FIG. 17 is a table indicating the peak power reduction of an array of solar cells as a function of the relative areas of the cells and associated bypass diodes, in accordance with various embodiments of the invention;

DETAILED DESCRIPTION

Figure 1A:
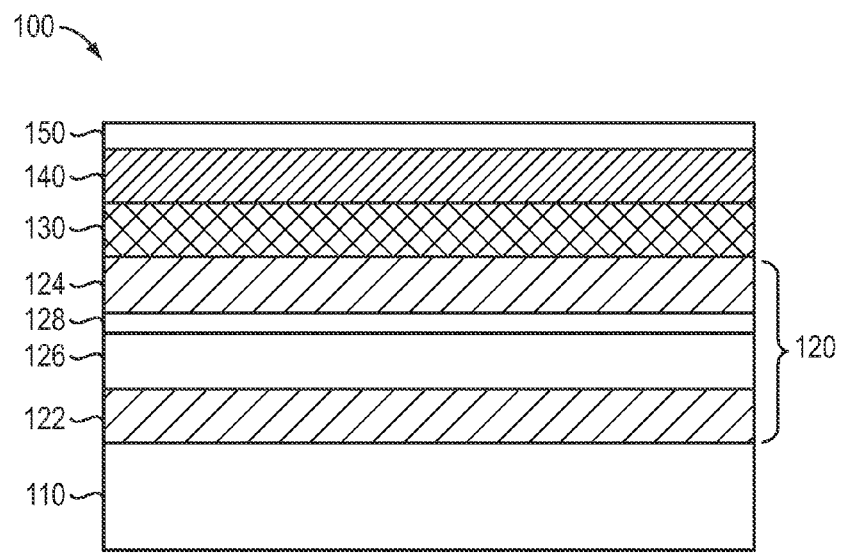
FIGS. 1A-14A (cross-sections) and 1B-14B (plan views) are schematic views of various steps for the formation of solar cell arrays with integrated devices in accordance with various embodiments of the invention.
Figure 1B:
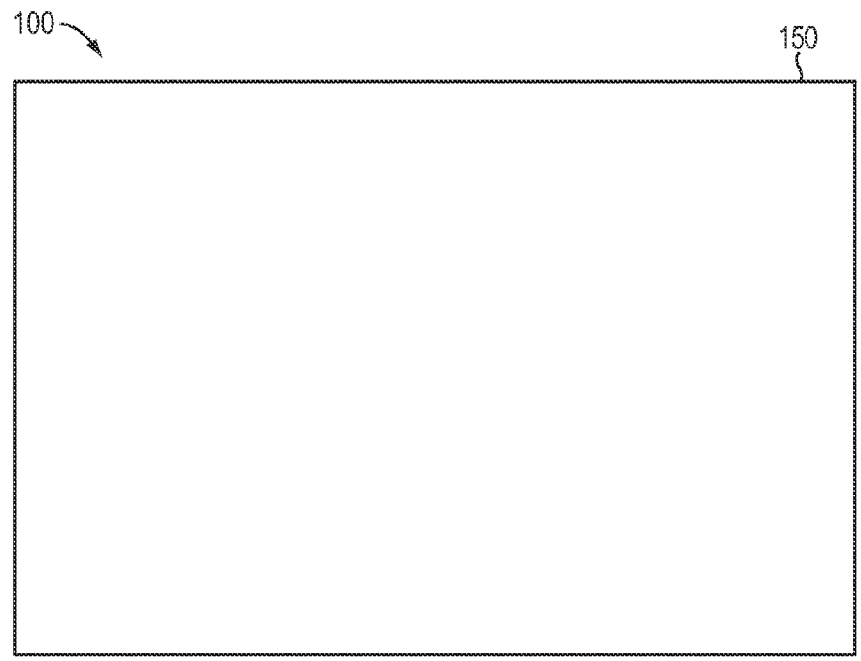

Embodiments of the present invention enable the fabrication of arrays of interconnected solar cells with integrated devices such as bypass diodes and/or other electronics on a common substrate. FIGS. 1A and 1B depict an exemplary layer structure suitable for implementation of such embodiments of the invention, and subsequent figures illustrate, for clarity, the formation of only one or two cells and integrated bypass diodes with the understanding that embodiments of the present invention typically incorporate many more such cell-and-integrated-device structures on a single substrate. As shown in FIG. 1A, formation of a solar-cell array 100 begins with the provision of a substrate 110. Substrate 110 preferably includes (at least on its surface) or consists essentially of Si. Substrate 110 may be, for example, a silicon-on-insulator (SOI) wafer, and/or may have a layer of Si (having, e.g., a different doping level than that of the bulk of the substrate) disposed on a top surface thereof (e.g., in the manner of an "epi-Si wafer"). For example, substrate 110 may include or consist essentially of a layer of Si over another material (which may be polycrystalline), such as silicon carbide. In an embodiment, substrate 110 consists essentially of, or even consists of, Si and various n-type and/or p-type dopants. In another embodiment, substrate 110 includes or consists essentially of a non-Si material that is compatible with Si microelectronics fabrication processes (to which III-V substrates such as GaAs and certain metals such as gold (Au) are typically anathema due to contamination concerns); suitable materials include, e.g., quartz or glass. Such a non-Si-containing substrate 110 may have a top layer of Si disposed thereon. The diameter of substrate 110 may be larger than approximately 100 mm, larger than approximately 200 mm, larger than approximately 300 mm, or even larger than approximately 450 mm. Since in preferred embodiments, substrate 110 includes or consists essentially of Si, substrate 110 generally has a diameter larger than would be possible were a compound semiconductor substrate (e.g., one including or consisting essentially of a III-V or a II-VI material) utilized.

In a preferred embodiment, substrate 110 does not include an active solar-cell junction (i.e., does not include a p-n or p-i-n junction designed to convert incident light into electrical current). Herein, omitting an active solar-cell junction is understood to connote the absence of an intentionally formed p-n junction in a particular material or layer. Solar photons may still be absorbed in such a layer, particularly if it has an appreciable thickness. Moreover, unintentional junctions may be formed in the material by, e.g., autodoping during growth of the material and/or other layers. At least the top surface of substrate 110 may have substantially a (100) crystalline orientation (e.g., substrate 110 may be a (100) Si wafer), although in various embodiments, at least the top surface of substrate 100 is "miscut," i.e., deliberately misoriented (or "tilted") away from a major crystallographic plane such as (100). In an embodiment, substrate 110 includes or consists essentially of a (100) Si substrate miscut between approximately 2° and approximately 10° along an in-plane <110> crystallographic direction. In a preferred embodiment, the miscut is approximately 6° along an in-plane <110> crystallographic direction.

In various embodiments, a template layer 120 is disposed over substrate 110. Template layer 120 typically mediates lattice mismatch between substrate 110 and the subsequently added solar-cell junctions (as further described below), thus minimizing the defect density in such junctions. Thus, preferably, a bottom portion of template layer 120 is substantially lattice-matched (as utilized herein, "substantially lattice-matched" may refer to having a lattice-parameter difference less than the approximate difference between the lattice parameters of Ge and GaAs, having a lattice-parameter difference less than approximately 0.2%, or a lattice-parameter difference even less than approximately 0.1%) to the top surface of substrate 110, and a top portion of template layer 120 is substantially lattice-matched to a solar-cell junction formed thereover. In an embodiment, template layer 120 includes or consists essentially of SiGe or GaAsP, at least a portion of which may be graded in composition as a function of the thickness of template layer 120. The thickness of template layer 120 may range between approximately 1 micrometer (μm) and approximately 10 μm, and template layer 120 may be doped with at least one n-type and/or p-type dopant. The graded portion of template layer 120 may have a grading rate (i.e., the rate of change of one component of the layer as a function of position within the layer thickness, e.g., the percentage change of germanium (Ge) as a function of height through the thickness of a SiGe graded layer) ranging between approximately 5%/μm and approximately 50%/μm, and preferably between approximately 10%/μm and approximately 25%/μm. Template layer 120 may include an upper portion having a substantially uniform composition, which may be the approximate composition of an upper portion of a graded portion of template layer 120. The upper, uniform-composition portion may have a thickness ranging between approximately 0.5 μm and approximately 2 μm. In a preferred embodiment, the thickness of the uniform-composition portion is approximately 1 μm. As detailed below, preferred embodiments feature a SiGe-based junction above or incorporated within (i.e., formed as at least a portion of) the uniform-composition portion of template layer 120.

In a particular embodiment, template layer 120 includes or consists essentially of graded SiGe topped with a layer of Ge or uniform-composition SiGe (e.g., $Si_{0.3}Ge_{0.7}$), which is approximately lattice-matched to certain III-V semiconductor materials such as GaAs or InGaP. In preferred embodiments in which template layer 120 includes or consists essentially of SiGe, the upper surface of template layer 120 preferably has a Ge concentration ranging between approximately 65% and approximately 95%, more preferably between approximately 75% and approximately 90%, and even more preferably between approximately 80% and approximately 90%. Template layer 120 is preferably formed as a continuous layer over and in direct contact with substantially all of the top surface of substrate 110. (Herein, layers are considered to be formed over "substantially all of a top surface" of a substrate or an underlying layer even if such formation leaves any negligible "gap," e.g., at an edge of the substrate due to imperfect layer formation or edge exclusion dictated by a particular process or particular processing equipment; however, layers formed only in specific patterned areas on a substrate are generally not considered to be over substantially all of a top surface, even if the spaces between areas are relatively small.) Template layer 120 may be formed by, e.g., an epitaxial deposition process such as chemical-vapor deposition (CVD). Metallorganic CVD (MOCVD) is typically used only for formation of III-V-based semiconductor materials. However, in an embodiment, template layer 120 (as well as other layers described herein) is formed in an MOCVD reactor capable of forming Si, SiGe, Ge, and III-V-based semiconductor materials. The reactor may be a close-coupled shower-head reactor in which gaseous precursors travel only a short distance (e.g., approximately 1 cm) from an unheated injection point to a substrate heated to a desired deposition temperature. In various embodiments, the growth rate of template layer 120 (and/or other layers described herein) is greater than approximately 500 nm/min, or even greater than approximately 700 nm/min. Template layer 120 (and/or other layers described herein) may be grown at a growth temperature between approximately 600° C. and approximately 900° C., e.g., approximately 750° C., at a growth pressure between approximately 10 Torr and approximately 200 Torr, e.g., approximately 100 Torr. Template layer 120 and/or junction 125 may be formed by flowing $SiH_4$ and $GeH_4$ in $H_2$ carrier gas. Template layer 120 preferably has a threading dislocation density (e.g., intersecting a top surface thereof) of less than approximately $10^7/cm^2$, and preferably less than approximately $10^6/cm^2$ or even less than approximately $10^5/cm^2$, as measured by plan-view transmission electron microscopy (TEM) or etch-pit density (EPD) measurements.

In certain embodiments, template layer 120 includes or consists essentially of a layer of uniform composition disposed directly over substrate 110. For example, template layer 120 may include or consist essentially of SiGe, GaAsP, InGaP, or GaAs formed directly over substrate 110 by, e.g., wafer bonding. However, direct growth of such materials with high lattice mismatch (e.g., greater than approximately 1-2%) to substrate 110 is not preferred due to the elevated defect levels that may result in template layer 120 and/or subsequently formed layers.

In various embodiments of the invention and as depicted in FIG. 1A, template 120 includes or consists essentially of a first graded portion 122 and a second graded portion 124. As described above, collectively graded portions 122, 124 preferably mitigate the lattice mismatch between substrate 110 and at least one cell formed thereover. As shown in FIG. 1A, the graded portions 122, 124 may be separated by one or both of a uniform-composition layer 126 and an isolation diode 128. Graded portions 122, 124, layer 126, and isolation diode 128 may include or consist essentially of the same material, e.g., SiGe. Preferably, layer 126 and/or diode 128 are locally lattice-matched within graded portions 122, 124, i.e., the composition of layer 126 and/or diode 128 is between and/or approximately equal to the uppermost composition of graded portion 122 and the lowermost composition of graded portion 124. Thus, the composition of layer 126 and/or diode 128 (and hence its location within and the relative thicknesses of graded portions 122, 124) may be selected based on, e.g., the desired bandgap and/or composition of isolation diode 128 without introduction of additional defects into array 100 due to lattice mismatch. (For layers 126 and/or isolation diodes 128 including or consisting essentially of SiGe, the Ge content of these layers is thus also typically less than that of any SiGe-based cells formed thereover, as detailed below.) In an exemplary embodiment, the composition of first graded portion 122 is graded from approximately 0% Ge content SiGe (i.e., substantially pure Si) to approximately 50% Ge content SiGe. The uniform-composition layer 126 may thus have a composition approximately equal to 50% Ge content SiGe, and may function as a uniform-composition platform for the formation of the isolation diode 128, which preferably has substantially the same composition. The presence of uniform-composition layer 126 may facilitate formation of isolation mesas to isolate active cells and/or bypass diodes or other devices, as detailed below.

The isolation diode 128 includes or consists essentially of a p-n or p-i-n junction of opposite polarity to that of the solar-cell junctions formed thereover, as isolation diode 128 is typically under reverse bias during normal operation, thereby preventing electrical conduction between different solar cells in the array (and/or conduction from the solar cell(s) to the substrate 110) and enabling formation of two top contacts for contacting the cells formed thereover (as detailed below). Although preferably the isolation diode 128 is formed between graded portion 122 and graded portion 124, it may instead be formed below graded portion 122 or above graded portion 124, and in such cases graded portions 122, 124 may collectively form a substantially continuous graded layer. Embodiments of the invention supplement or replace the isolation diode 128 with an insulating layer (e.g., an oxide and/or nitride layer), which may be present in or above the substrate 110 (e.g., in the manner of an SOI wafer). Additionally (or instead), inter-cell isolation may be accomplished via later removal of most or all of the substrate 110 and layer structure below the cells. After such substrate removal, an insulating material (e.g., a polymer) may be formed above and/or below the cells for mechanical support.

Disposed over template layer 120 (or within a uniform-composition portion thereof, as described above) is a SiGe cell 130, which may include a p-type-doped subregion, an intrinsically doped (i.e., "undoped," or "not intentionally doped") subregion, and an n-type-doped subregion. In various embodiments, the intrinsically doped subregion is omitted. As utilized herein, a "junction" or "cell" (or in some instances, a "sub-cell") refers to at least two layers having different (e.g., opposite) doping polarities that may be in direct contact, e.g., a p-n junction or a p-i-n junction. The SiGe cell 130 is preferably formed over substantially the entire top surface of template layer 120 (and therefore over substantially the entire top surface of substrate 110). The p-type-doped subregion of the SiGe cell 130 may be formed over the n-type-doped subregion or vice versa, but the polarity of the SiGe cell 130 is preferably opposite that of the isolation diode 128. In some embodiments, a p-type-doped subregion formed over an n-type-doped subregion provides the array 100 with more resistance to radiation damage (and thus, increased suitability for non-terrestrial applications) than embodiments in which the doping types of these subregions are swapped. The SiGe cell 130 preferably includes or consists essentially of SiGe, e.g., SiGe having a Ge composition between approximately 65% and approximately 95%. In preferred embodiments, SiGe cell 130 is substantially lattice-matched to at least one III-V-based junction formed thereover (as described below). Herein, consisting essentially of SiGe does not preclude the presence of dopants and/or other charge-modifying agents therein, but does preclude the presence of other semiconductor materials, e.g., III-V semiconductors. For example, the layers of SiGe cell 130 may consist essentially of doped or undoped SiGe, e.g., SiGe having a Ge composition of approximately 70% that is substantially lattice-matched to InGaP or GaAsP. In various embodiments, an upper portion of template layer 120 and at least a portion of SiGe cell 130 (and/or any subsequently added cells described below) have a lattice mismatch to Ge of greater than approximately 1%.

Disposed over SiGe cell 130 is at least one III-V cell 140, each of which may include a p-type-doped subregion, an intrinsically doped subregion, and an n-type-doped subregion. In various embodiments, the intrinsically doped subregion is omitted. The III-V cell 140 is preferably formed over substantially the entire top surface of SiGe cell 130 and/or template layer 120 (and therefore over substantially the entire top surface of substrate 110). The p-type-doped subregion of each III-V cell 140 may be formed over the n-type-doped subregion or vice versa, but the polarity of the III-V cell 140 is preferably opposite that of the isolation diode 128 and equal to that of the SiGe cell 130. In some embodiments, a p-type-doped subregion formed over an n-type-doped subregion provides the array 100 with more resistance to radiation damage (and thus, increased suitability for non-terrestrial applications) than embodiments in which the doping types of these subregions are swapped. Each III-V cell 140 includes or consists essentially of at least one compound semiconductor (e.g., III-V) material, such as GaAs, InGaP, AlGaP, AlGaAs, GaP, AlGaSb, GaSb, InP, InAs, InSb, InAlGaP, GaAsP, GaSbP, AlAsP, AlSbP, and/or any alloys or mixtures thereof, although Al-containing materials are not preferred. Herein, consisting essentially of at least one compound semiconductor material does not preclude the presence of dopants and/or other charge-modifying agents therein. Preferably, III-V cell 140 does not include elemental Si or Ge or alloys or mixtures thereof, except for Si or Ge utilized as an n-type or p-type dopant. In some embodiments, III-V cell 140 is substantially lattice-matched to SiGe cell 130; however, in other embodiments the two junctions are lattice-mismatched due to, e.g., SiGe cell 130 incorporating a graded-composition layer therein. In such embodiments, SiGe cell 130 may have a larger lattice constant that that of one or more III-V cells 140.

For example, SiGe cell 130 may include or consist essentially of SiGe having a Ge concentration ranging between approximately 75% and approximately 95%, more preferably between approximately 80% and approximately 90%, while one or more III-V cells 140 may have a lattice constant substantially lattice-matched to SiGe having a Ge concentration of approximately 70%.

Solar cells formed in accordance with various embodiments of the invention may incorporate a SiGe cell 130 and one or more III-V cells 140 having bandgaps optimized for collection of solar photons in terrestrial or space applications. Conventional state-of-the-art triple junction cells are fabricated on Ge substrates (i.e., on the Ge lattice constant), thus limiting the bandgaps of the subcells to 0.67 eV (Ge), 1.4 eV (GaAs) and 1.8 eV (InGaP). The conventional bandgap combination is far from optimal, resulting in a maximum AM0 efficiency of less than approximately 30%. Embodiments of the invention utilize a SiGe-based template layer 120 to access a wide range of lattice constants and bandgaps, including those more optimal for harnessing the energy of the AM0 solar spectrum: 0.9 eV (e.g., SiGe), 1.55 eV (e.g., GaAsP or GaPSb) and 2.3 eV (e.g., InGaP). Unlike conventional bulk substrates such as Si, Ge, or GaAs, SiGe spans a wide range of lattice constants, allowing for a high degree of flexibility in designing the bandgap profile for a multi junction solar cell. In addition, SiGe itself provides a favorable bandgap (approximately 0.9 eV) for the bottom cell for multi junction cells optimized for the air-mass-zero ("AM0," corresponding to the solar spectrum outside the atmosphere of the earth) and air-mass-1.5 ("AM1.5," corresponding to the solar spectrum on the surface of the earth at a solar zenith angle of approximately 48°) spectra. Compared to materials systems such as pure Ge and InGaAs, SiGe enables the largest bandgap range and is the only system that spans the bandgaps required to make the most efficient AM0 and AM1.5 cells.

Embodiments of the invention achieve a short-circuit current density ($J_{sc}$) of >40 mA/cm$^2$. Compared to the Ge bottom cell of a conventional triple junction, the SiGe cell 130 increases the open-circuit voltage ($V_{oc}$) by a factor of two with no reduction in current for the array 100, i.e., SiGe cell 130 produces enough current that it does not limit the other cells in the structure. The excess current also enables the use of a partitioned SiGe cell 130, as described in the '078 and '089 applications.

Furthermore, on the SiGe lattice constant, a 1.8-2.3 eV III-V cell 140 may be formed without the use of Al-containing semiconductors. Although Al content tends to increase the bandgap of many semiconductors, the use of Al is of limited practical importance because the $V_{oc}$ of solar cells that utilize Al does not correlate strongly with bandgap (likely owing to the fact that Al-containing semiconductors tend to contain a high concentration of oxygen impurities that degrades the minority carrier lifetime). Various embodiments of the present invention provide one or more III-V cells 140 having bandgaps ranging from approximately 1.8 eV to approximately 2.3 eV without the use of Al-containing semiconductors, providing a significant advantage over the current state of the art. For example, various embodiments of the invention enable the formation of InGaP-based III-V cells 140 having bandgaps greater than approximately 1.9 eV, or even greater than approximately 2.1 eV (and/or less than approximately 2.3 eV). On conventional GaAs substrates, the bandgap of InGaP-based cells is constrained to be lower than approximately 1.9 eV, and the addition of Al thereto (in order to increase the bandgap) significantly and deleteriously shortens the carrier lifetimes therein. As utilized herein, a cell substantially free of Al may refer only to the "active" portions of the junction that produce photocurrent (e.g., emitter and base layers), i.e., other layers such as "back surface field" (BSF) or "window" layers may include Al (as such Al may advantageously increase the bandgap of such layers but have no impact on the electrical performance of the cell).

Each of the subregions of the SiGe cell 130 and/or the III-V cell(s) 140 may include or consist essentially of one layer or multiple layers having different doping levels and/or thicknesses, e.g., so-called "base" layers, "emitter" layers, "window" layers, "back surface field" (BSF) layers, etc., as these are known and defined in the art. At least a portion of the SiGe cell 130 is preferably approximately lattice-matched to an upper portion of template layer 120, and at least a portion of a III-V cell 140 is preferably approximately lattice-matched to a portion of the SiGe cell 130. However, in some embodiments, SiGe cell 130 may include a transition layer, e.g., a relaxed graded-composition layer, that mediates any lattice mismatch between SiGe cell 130 and III-V cell 140. For example, SiGe cell 130 may include a SiGe layer graded to a SiGe composition different from that of SiGe cell 130 (in the manner of template layer 120) to a SiGe composition having a lattice parameter substantially lattice-matched to at least a portion of III-V cell 140. Cells 130, 140 preferably have threading dislocation densities (e.g., intersecting a top surface thereof) of less than approximately $10^7$/cm$^2$, and preferably less than approximately $10^6$/cm$^2$ or even less than approximately $10^5$/cm$^2$, as measured by plan-view TEM or EPD measurements. III-V cell 140 is also preferably at least substantially free of anti-phase boundaries (APBs), e.g., at the interface between III-V cell 140 and SiGe cell 130, as measured by cross-sectional and/or plan-view TEM or EPD measurements. In certain embodiments, the use of a miscut substrate 110 facilitates the formation of a III-V cell 140 that is substantially free of APBs. Cells 130, 140 are preferably each formed as a continuous layer (or multiple layers) over and in direct contact with substantially all of the top surface of template layer 120 and cell 130 respectively. Cells 130, 140 may be formed by, e.g., an epitaxial deposition process such as CVD. In an embodiment, substrate 110 (e.g., having template layer 120 and SiGe cell 130 disposed thereover) is annealed (e.g., at a temperature of approximately 650° C.) prior to formation of III-V cell 140 or other III-V semiconductor-based layers. The anneal may promote high-quality formation of III-V cell 140 by forming a "double-step" surface on SiGe cell 130. A tunnel junction (e.g., one incorporating both SiGe and a III-V material) may be formed at the interface between the SiGe cell 130 and the III-V cell 140, as described in the '078 and '089 applications.

As described herein, SiGe cell 130 and III-V cell(s) 140 are preferably formed by epitaxial deposition rather than by, e.g., wafer bonding. (Although such a preference does not preclude wafer bonding utilized to form, e.g., a handle substrate over the stack of cells, as described below, or a template layer beneath the stack of cells, as described above.) Specifically, preferably there is no bonded interface between SiGe cell 130 and a III-V cell 140 and/or between multiple III-V cells 140. As is known in the art, a bonded interface typically includes an array of substantially edge-type dislocations due to lattice mismatch between bonded layers and/or an array of substantially screw-type dislocations due to misorientation between bonded layers, and is structurally quite different from an interface between two materials both formed by epitaxial growth.

With continued reference to FIG. 1A, a cap layer 150 may be disposed over SiGe cell 130 and one or more III-V cells 140, as described in the '078 and '089 applications. Cap layer 150 may include or consist essentially of a semiconductor material that is compatible with Si microelectronics fabrication processes, and in a preferred embodiment, cap layer 150 includes or consists essentially of doped or undoped Si. (Herein, a cap layer 150 including Si connotes a layer that is an alloy or mixture of Si and another element, e.g., Ge, precluding layers, e.g., III-V layers, that merely contain Si as a dopant.) In an embodiment, the thickness of cap layer 150 is less than an absorption length for solar photons in Si (e.g., less than approximately 100 nm), such that the solar response of the cells in array 100 is not detrimentally affected by absorption in cap layer 150. In a preferred embodiment, the thickness of cap layer 150 is less than approximately 50 nm, or even less than approximately 20 nm. In another embodiment, the thickness of cap layer 150 is greater than the absorption length for solar photons in Si, but at least a portion of cap layer 150 is removed after formation of at least one contact thereto. After formation of cap layer 150, SiGe cell 130 and III-V cell(s) 140 may be substantially, or even completely, encapsulated by a material (e.g., Si) or materials compatible with Si microelectronics fabrication processes. Since cap layer 150 is formed after III-V cell 140, it at least substantially coats all compound-semiconductor material disposed over substrate 110, including at the edge thereof. Thus, in accordance with embodiments of the invention, array 100 may be manufactured in a conventional Si fabrication facility since it outwardly resembles a Si wafer (or, at a minimum, a wafer compatible with Si-based microelectronics fabrication).

Cap layer 150 may have a sheet resistance less than approximately 1000 Ω/square. The sheet resistance of cap layer 150 may be even lower, e.g., less than approximately 100)/square. In various embodiments, a cap layer 150 having such a low sheet resistance and including or consisting essentially of Si may deleteriously attenuate incident sunlight, as it may have a thickness greater than an absorption length. Thus, in various embodiments of the invention, cap layer 150 may include or consist of a "sublayer" including or consisting essentially of Si disposed above (and preferably in direct contact with) a sublayer including or consisting essentially of a low-resistance III-V material having a low absorption coefficient for solar photons, e.g., GaP or AlP. Either or both sublayers in cap layer 150 may be doped. As further described below, cap layer 150 or a portion thereof may include various crystallographic defects without substantial impact on the performance of the cells in array 100.

Cap layer 150 may be incorporated into the design of (and may be disposed beneath) an anti-reflection coating (which typically includes or consists essentially of silicon nitride and/or silicon dioxide, as described below). In an embodiment, the anti-reflection coating and/or another protective layer provides additional encapsulation, particularly at the edge of the substrate. Cap layer 150 may be formed by, e.g., an epitaxial deposition process such as chemical-vapor deposition, and is preferably single-crystalline. In various embodiments, cap layer 150 is polycrystalline or even amorphous. In a preferred embodiment, cap layer 150 is substantially planar, notwithstanding the lattice mismatch between cap layer 150 and III-V cell 140. In various embodiments, a thin (e.g., having a thickness ranging from approximately 1 nm to approximately 10 nm) nucleation layer (not shown) is formed between III-V cell 140 and cap layer 150 in order to improve the nucleation and morphology of cap layer 150. The nucleation layer may include or consist essentially of a compound semiconductor material such as GaAs. In an embodiment, cap layer 150 is formed at a temperature ranging between approximately 550° C. and approximately 750° C. (e.g., approximately 650° C.), or even at lower temperatures, in order to facilitate a high degree of planarity. Cap layer 150 may be formed via use of a gaseous precursor such as silane, disilane, or trisilane to facilitate formation at sufficient growth rates at low formation temperatures. In various embodiments, at least a portion of cap layer 150 is at least partially, or even substantially completely, relaxed to its equilibrium lattice parameter. In such embodiments, cap layer 150 may include a finite concentration of misfit dislocations, threading dislocations, and/or stacking faults, and the threading dislocation density of cap layer 150 may be higher than that of III-V cell 140 by at least approximately an order of magnitude, or even at least two orders of magnitude. Cap layer 150 may be polycrystalline and include a finite concentration of grain boundaries, even though III-V cell 140 is preferably single-crystalline. Conventional compound semiconductor-based solar cells avoid the incorporation of severe lattice mismatch (e.g., greater than approximately 1%, greater than approximately 2%, or even greater than approximately 4%) and/or group IV-based materials due to the detrimental effects on the performance (e.g., the efficiency) of such cells due to the introduction of the above-described defects and/or due to deleterious absorption of solar photons. Unexpectedly, the relatively thin thickness of cap layer 150 (and/or the fact that at least portions of cap layer 150 may be removed during processing) substantially prevents such defects from impacting the performance of the cells in array 100. In preferred embodiments, substantially none of the above-described defects present in cap layer 150 propagate into SiGe cell 130 or III-V cell 140. Preferably, cap layer 150 is single-crystalline, regardless of the lattice mismatch between it and III-V cell 140 and the amount of lattice relaxation of cap layer 150.

Cap layer 150 may be doped with one or more n-type or p-type dopants, and the doping type and/or doping concentration of cap layer 150 preferably matches that of the subregion of III-V cell 140 directly therebelow. Typically, the doping type of cap layer 150 will be different from the doping type of substrate 110 and/or template layer 120. However, surprisingly, it has been found that a p-type-doped cap layer 150 may be utilized to form low-resistivity contacts to III-V cell 140 even if formed on an n-type doped subregion thereof. Thus, in some embodiments, a p-type-doped cap layer 150 is utilized over III-V cell 140 of either polarity orientation (i.e., p-type over n-type or vice versa). Such a layer may beneficially enable lower resistivity contacts to III-V cell 140, as layers including or consisting essentially of Si may generally be doped p-type at higher levels than they may be doped n-type.

In some embodiments, cap layer 150 is "autodoped" either n-type or p-type by incorporation of one or more of the elements present in III-V cell 140 (and, in such embodiments, the concentration profile of the dopant(s) in cap layer 150 may be "diffused"). Thus, if the autodoping type is the desired doping type for cap layer 150, a doped cap layer 150 may be formed without the introduction of additional dopant precursors. In contrast, if the autodoping type is that opposite the desired type for cap layer 150, the intentionally introduced dopants are provided at a higher concentration than the autodoping concentration (e.g., greater by at least approximately one order of magnitude). In certain embodiments, the autodoping concentration ranges from approximately $10^{19}$/cm$^3$ to approximately $2 \times 10^{20}$/cm$^3$, or even to approximately $5 \times 10^{20}$/cm$^3$. In various embodiments, cap layer 150 may be intentionally doped at levels ranging from approximately $10^{21}$/cm$^3$ to approximately $10^{22}$/cm$^3$.

Figure 2A:
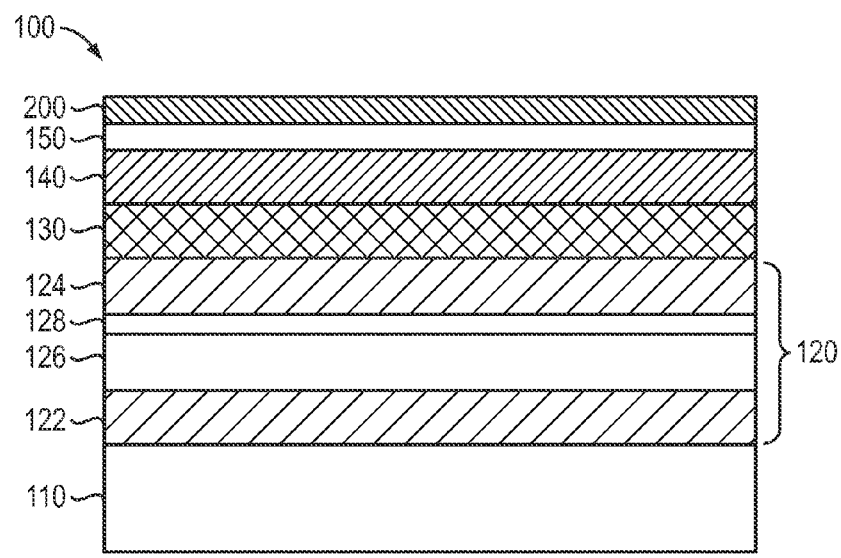
Figure 2B:
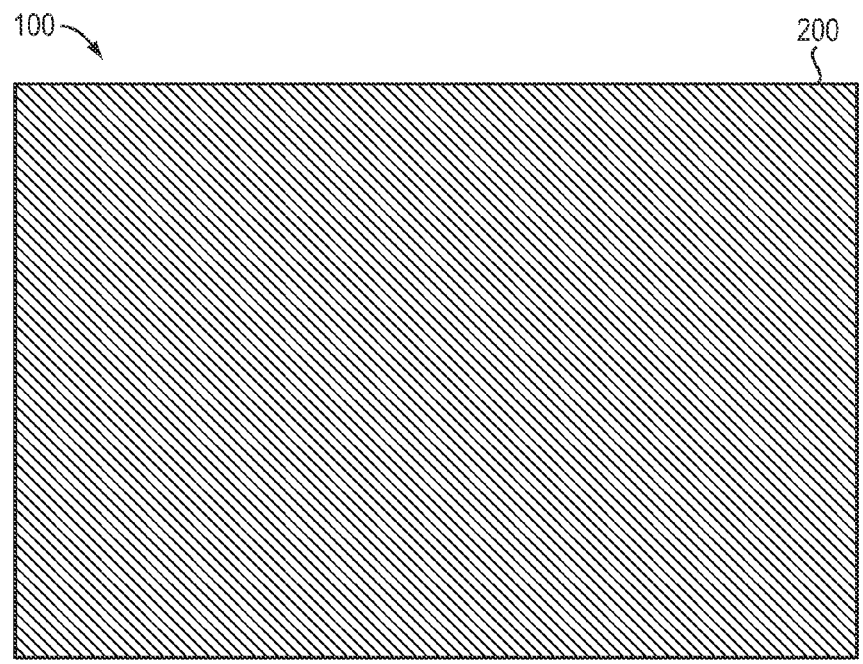

As shown in FIGS. 2A and 2B, an anti-reflective coating 200 is deposited over cap layer 150 by, e.g., sputtering or CVD. The anti-reflective coating 200 preferably has a thickness selected such that interference effects in the coating cause radiation reflected from its top surface to be out-of-phase with radiation reflected from the underlying semiconductor surface. The out-of-phase radiations destructively interfere with one another, resulting in substantially zero net reflected energy from the cells in array 100. In various embodiments, multiple anti-reflective coatings 200 are disposed over cap layer 150 (or over III-V cell 140 if cap layer 150 is absent), and each anti-reflective coating 200 minimizes reflected solar energy of a particular wavelength. Anti-reflective coating 200 preferably substantially prevents carrier recombination at the surface of array 100, and may include or consist essentially of one or more dielectric materials (e.g., in discrete layers) such as an oxide, nitride, and/or oxynitride, e.g., silicon nitride, silicon oxide, silicon oxynitride, indium tin oxide, and/or titanium dioxide. In some embodiments of the invention, anti-reflective coating 200 constitutes only a portion (e.g., a silicon nitride layer) of the final anti-reflective coating present on the finished cells in array 100, and the remaining portion(s) of the coating (e.g., one or more layers including or consisting essentially of one or more of the materials listed above) are formed on the cells later in the fabrication process, e.g., after definition of cell and/or bypass diode (or other device) mesas.

Figure 3A:
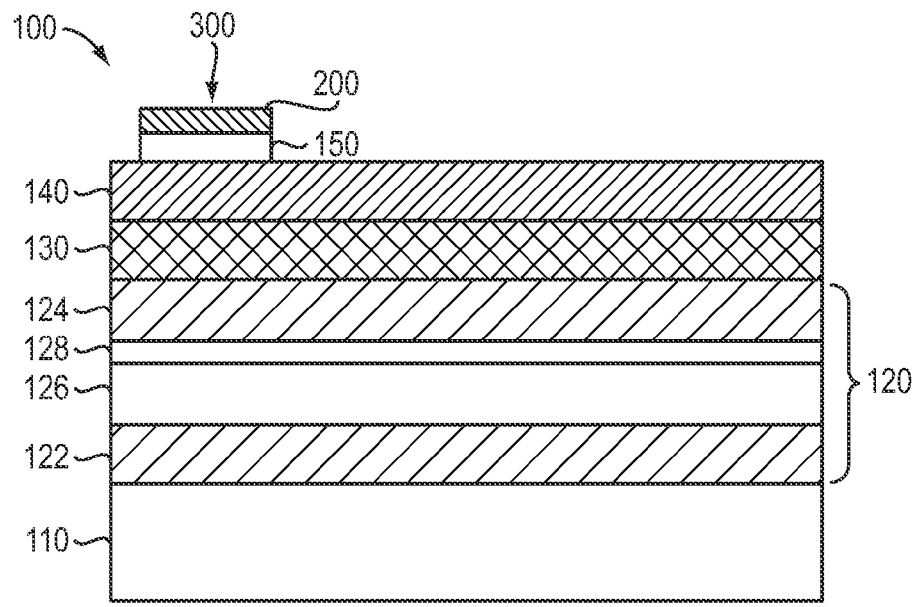
Figure 3B:
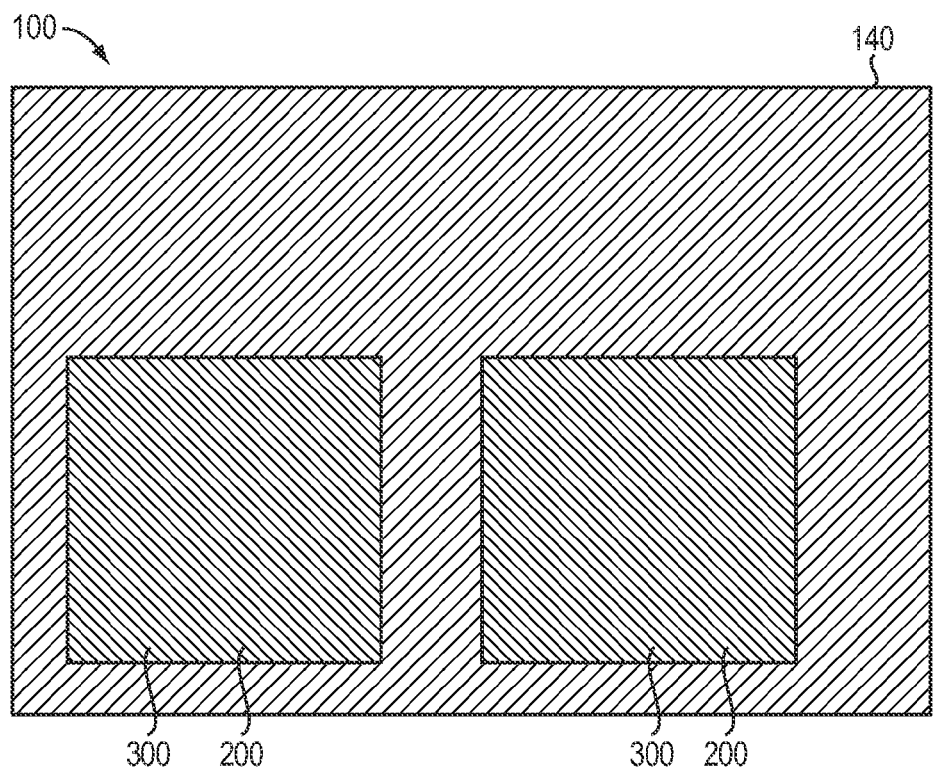
Figure 4A:
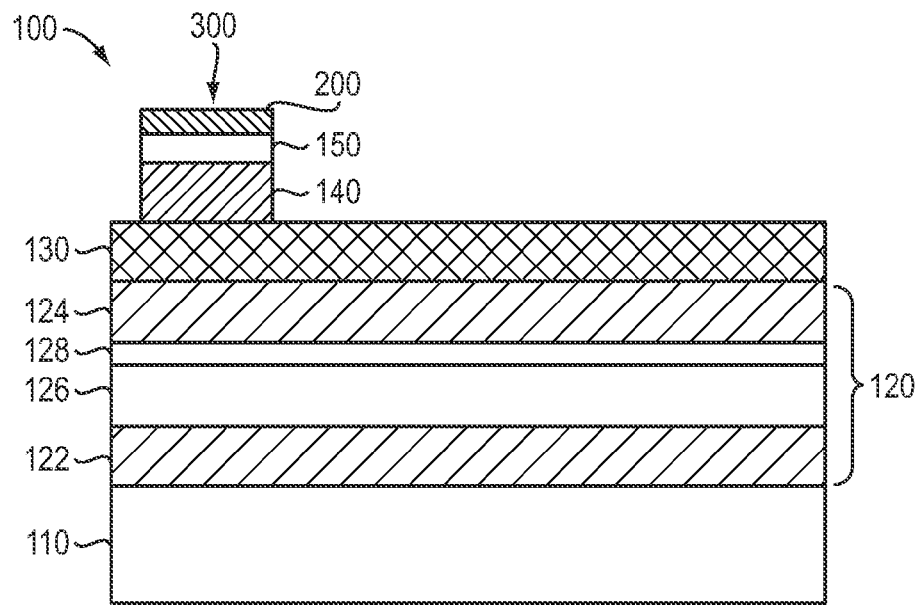
Figure 4B:
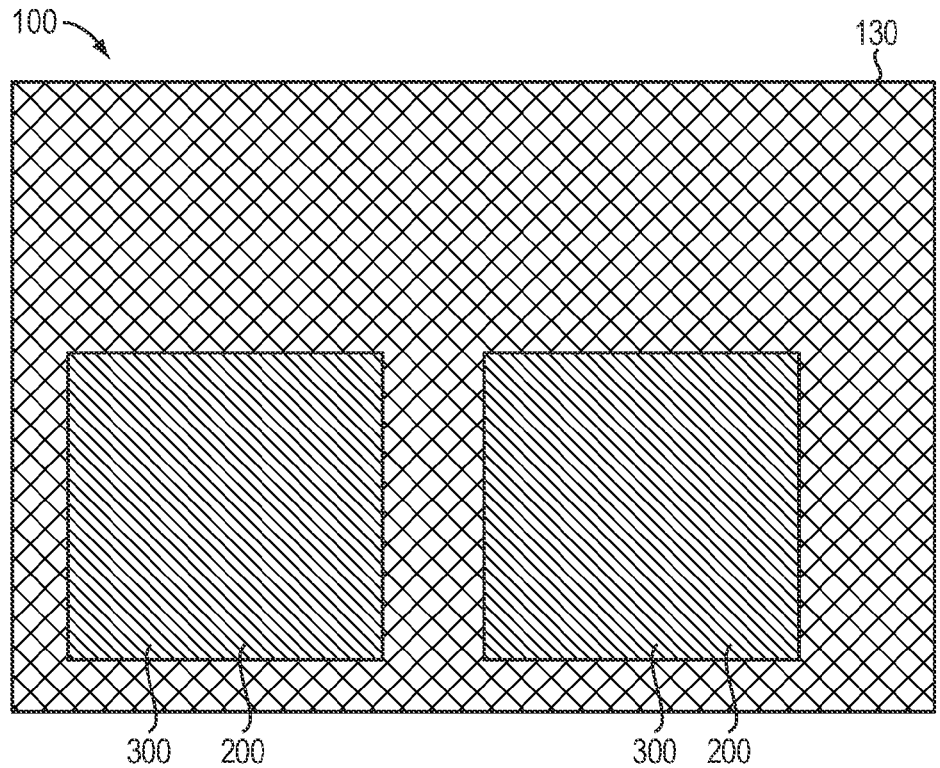

The patterning and formation of the solar cells in array 100 are initiated as depicted in FIGS. 3A and 3B. As shown, areas 300 in which the cells are to be formed are defined (by, e.g., conventional photolithographic processes), and portions of anti-reflective coating 200 and cap layer 150 outside of areas 300 are removed by, e.g., wet or dry etching. The etch process may be timed or may be selective to the III-V cell 140 layers beneath cap layer 150. In an embodiment, these portions of anti-reflective coating 200 and cap layer 150 are removed by reactive ion etching (RIE) using a mixture of $CF_4$ and $O_2$. As shown in FIGS. 4A and 4B, the definition of individual solar cells in areas 300 continues with the removal of portions of the III-V cell(s) 140 outside of areas 300 by, e.g., wet or dry etching. Preferably the etch process is selective to the SiGe cell 130 underlying the III-V cell 140. Suitable wet etches may utilize dilute solutions of $NH_4OH:H_2O_2:H_2O$ (e.g., at a mixture of 1:1:30, or with even more water), $H_3PO_4:H_2O_2:H_2O$, and/or HCl (undiluted or diluted up to 1:3 with $H_2O$; particularly with higher In-content layers). The etch rates and selectivities may depend on dilution and material composition of the material being etched.

Figure 5A:
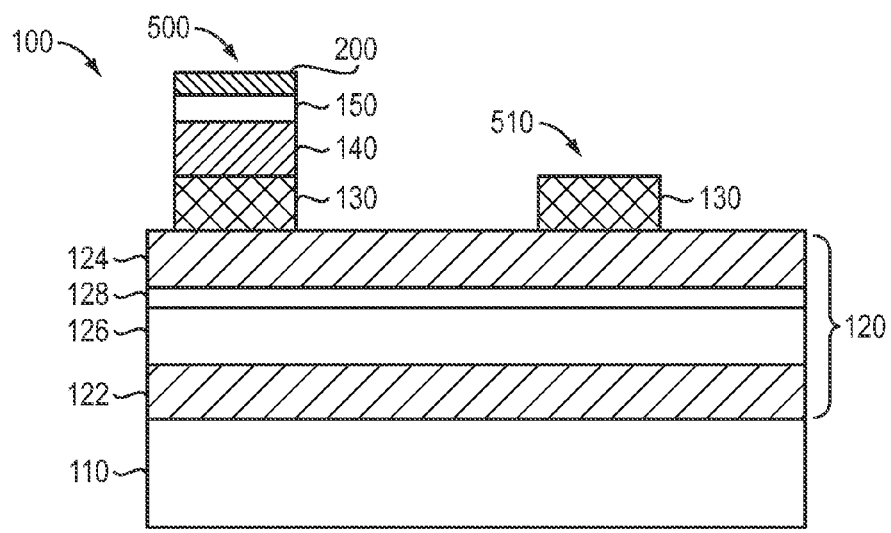
Figure 5B:
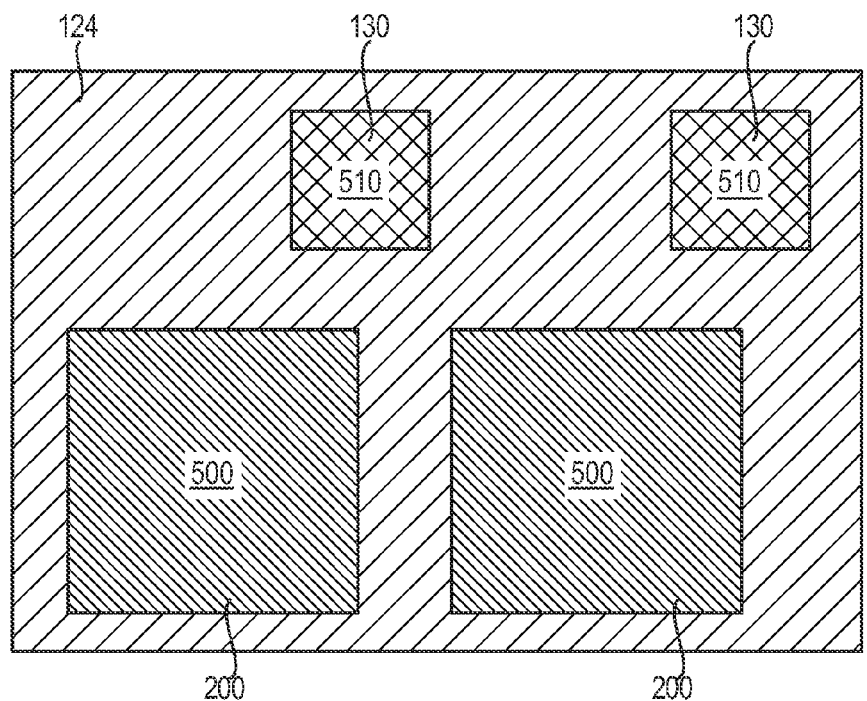

After removal of portions of the III-V cell(s) 140, portions of the SiGe cell 130 are removed to define the active cell mesas 500 and the bypass diode mesas 510, as shown in FIGS. 5A and 5B. While preferably (as shown in FIGS. 5A and 5B) one bypass diode mesa 510 is defined for each active cell mesa 500, in various embodiments of the invention a bypass diode mesa 510 may be associated with more than one active cell mesa 500. After the regions corresponding to mesas 500 and/or mesas 510 are defined by, e.g., conventional photolithographic processes, portions of the SiGe cell 130 not in such areas are removed by, e.g., wet or dry etching. In a preferred embodiment, these portions of SiGe cell 130 are removed via RIE utilizing a mixture of $SF_6$ and $C_4F_8$.

Figure 6A:
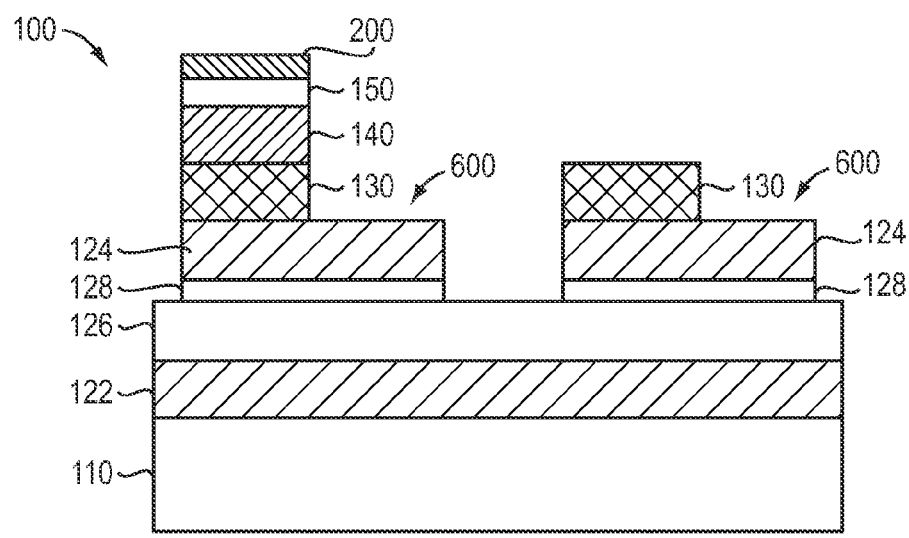
Figure 6B:
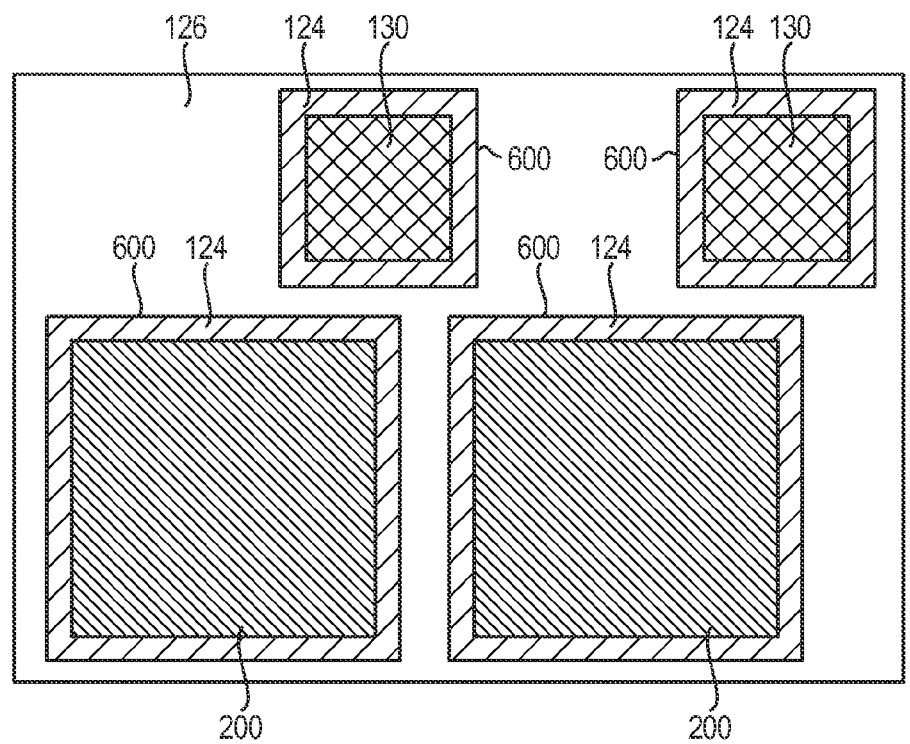

As shown in FIGS. 6A and 6B, isolation mesas 600 are formed via the removal of portions of graded portion 124 and isolation diode 128 in regions between the active devices and/or bypass diodes (or other devices) being formed. These portions of graded portion 124 and isolation diode 128 may be removed via, e.g., wet or dry etching, and in a preferred embodiment are removed via RIE utilizing a mixture of $SF_6$ and $C_4F_8$. Due at least to the presence of the isolation diode 128 in the stacks of layers forming the active cells and the bypass diodes, the formation of the isolation mesas 600 enables electrical isolation during operation of array 100.

Figure 7A:
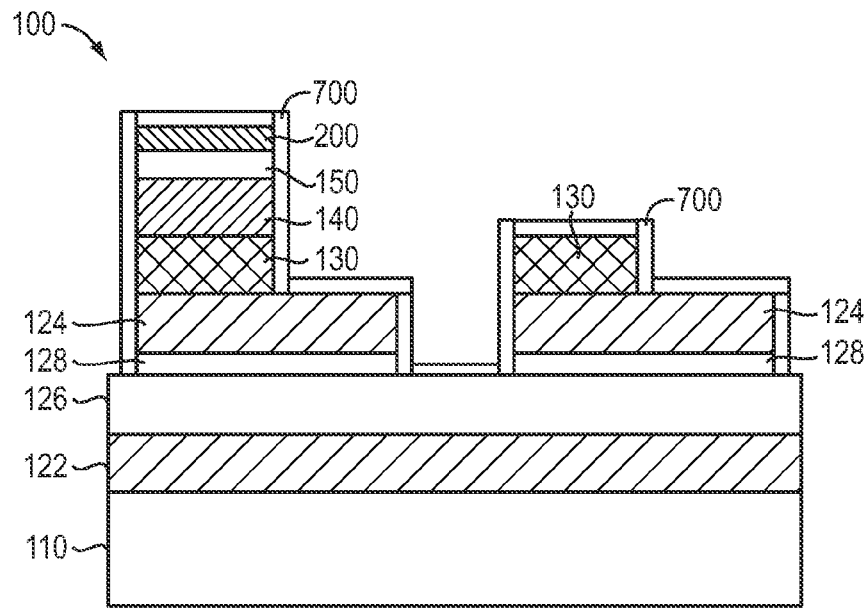
Figure 7B:
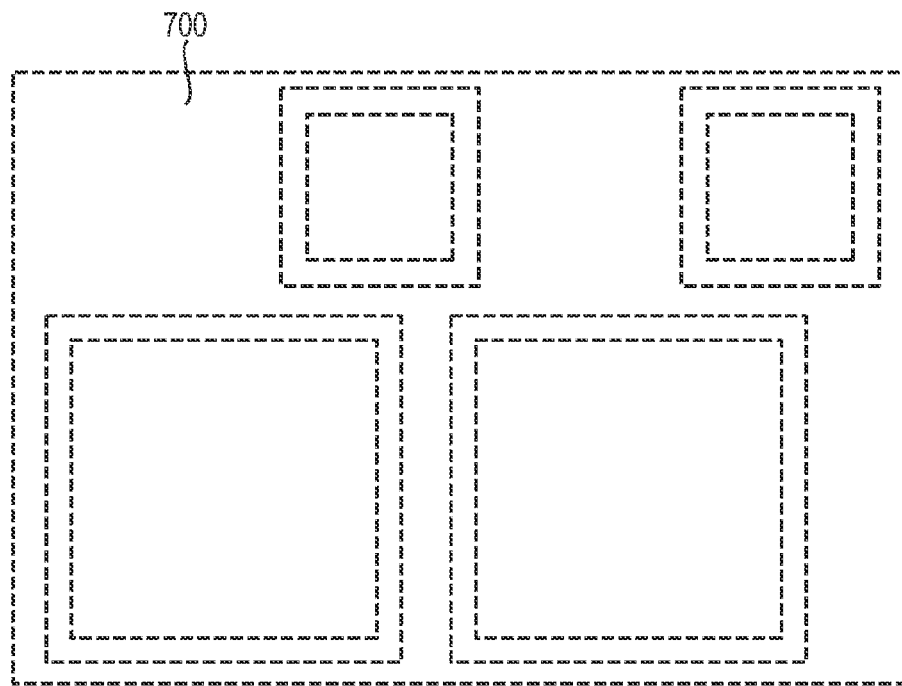
Figure 8A:
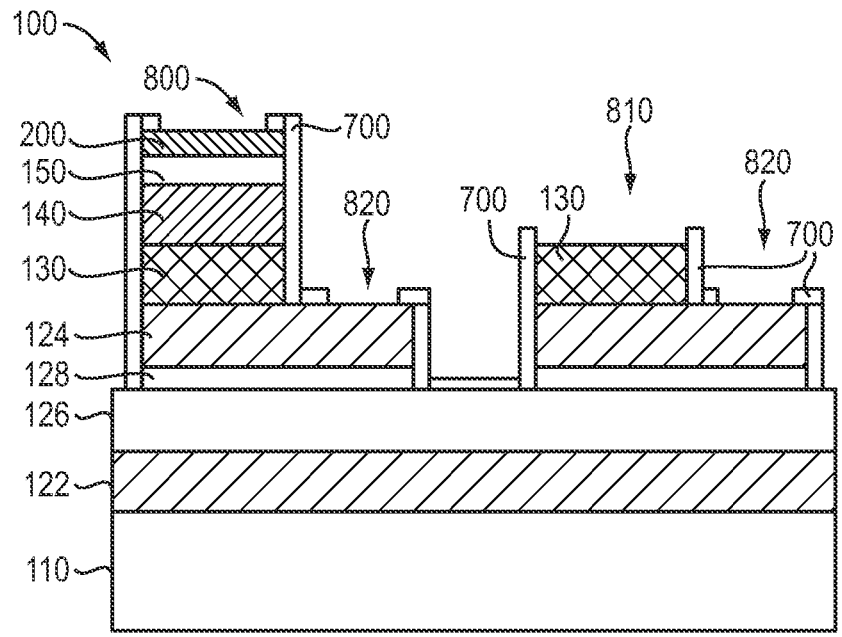
Figure 8B:
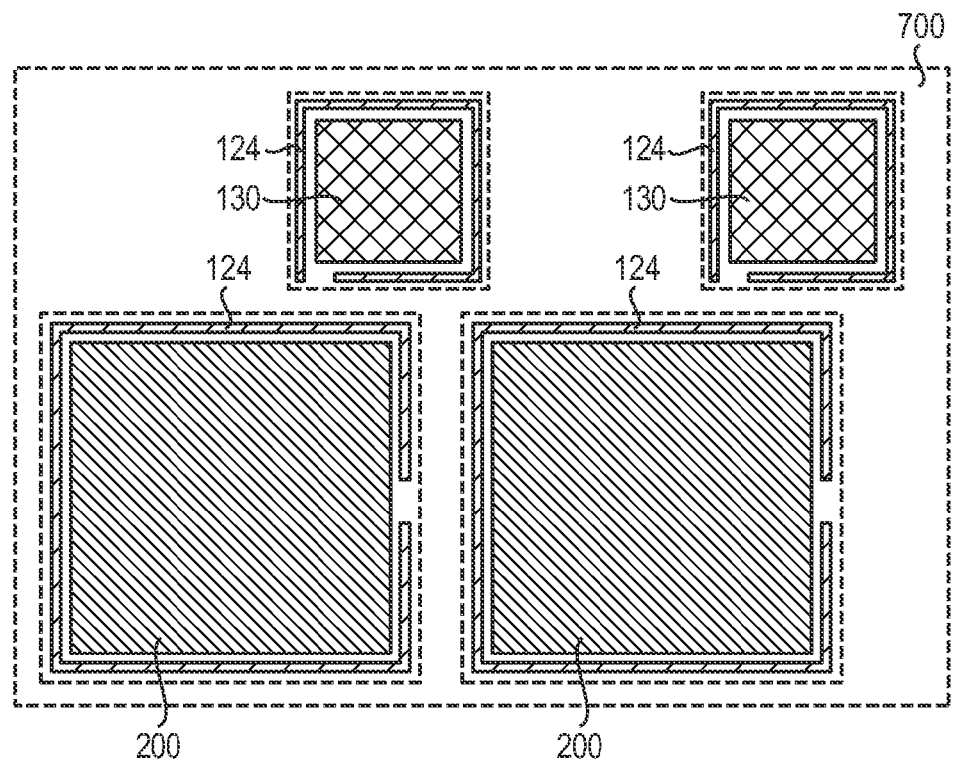

FIGS. 7A and 7B depict the subsequent formation of a dielectric layer 700 that preferably conformally coats the partially completed cell and diode structures and isolation mesas 600. The dielectric layer 700 may include or consist essentially of one or more insulating materials, e.g., silicon dioxide. In preferred embodiments of the invention, the dielectric layer 700 provides sidewall passivation for the completed solar cells and bypass diodes (and/or other devices), as well as isolation for conductive interconnects to be added (as described below). FIGS. 8A and 8B depict the patterning (by, e.g., conventional photolithography) and removal of portions of the dielectric layer 700 to expose active cell area 800, bypass diode area 810, and contact vias 820. The portions of the dielectric layer 700 may be removed by, e.g., wet or dry etching. In a preferred embodiment, the portions of dielectric layer 700 are removed via RIE using a mixture of $CHF_3$ and $CF_4$.

Figure 9A:
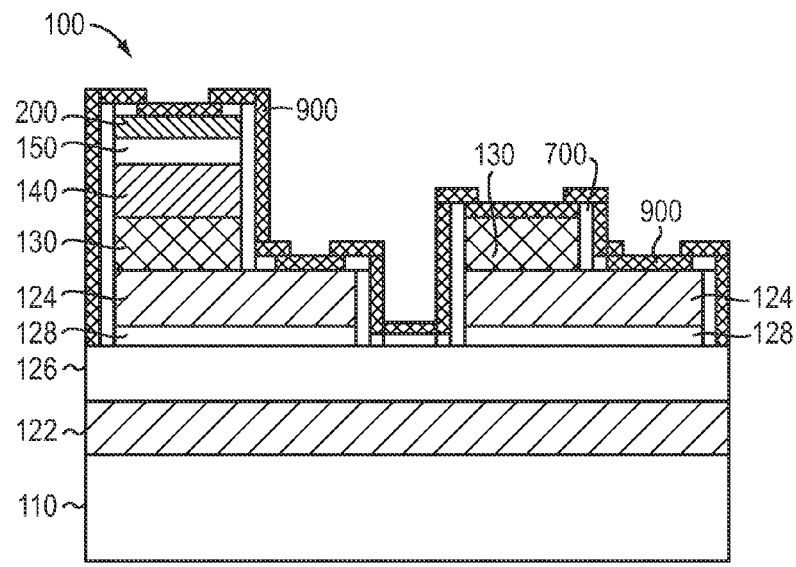
Figure 9B:
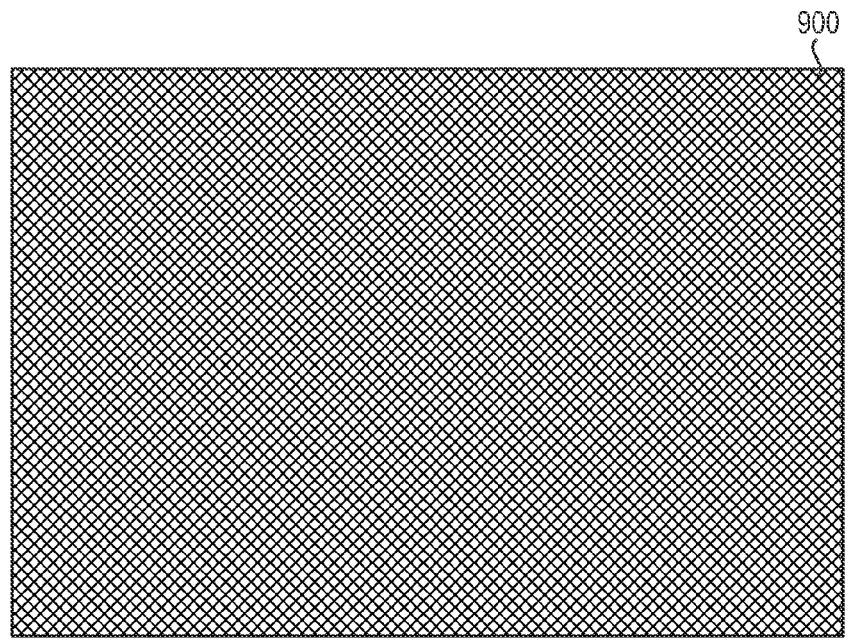
Figure 10A:
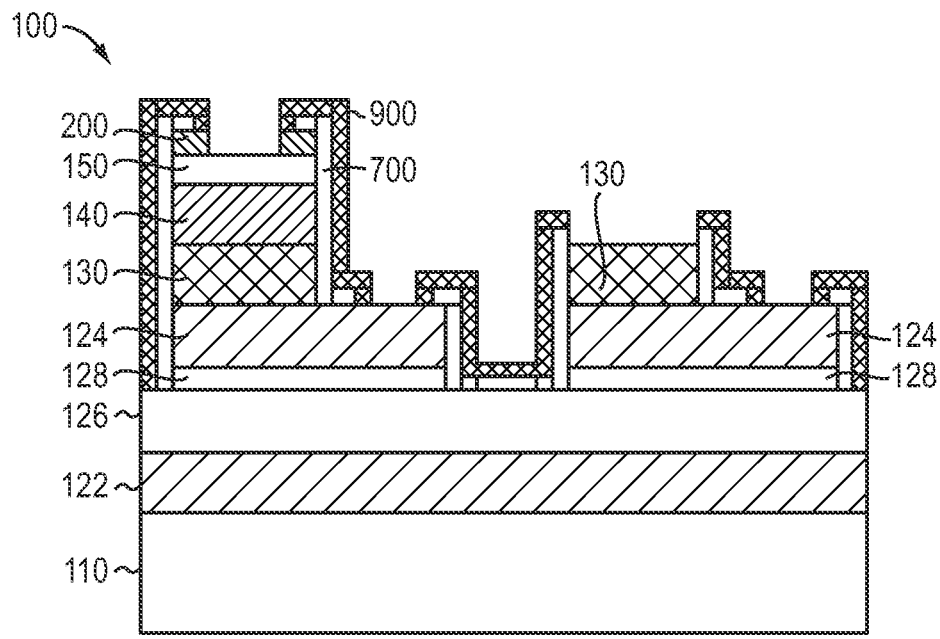
Figure 10B:
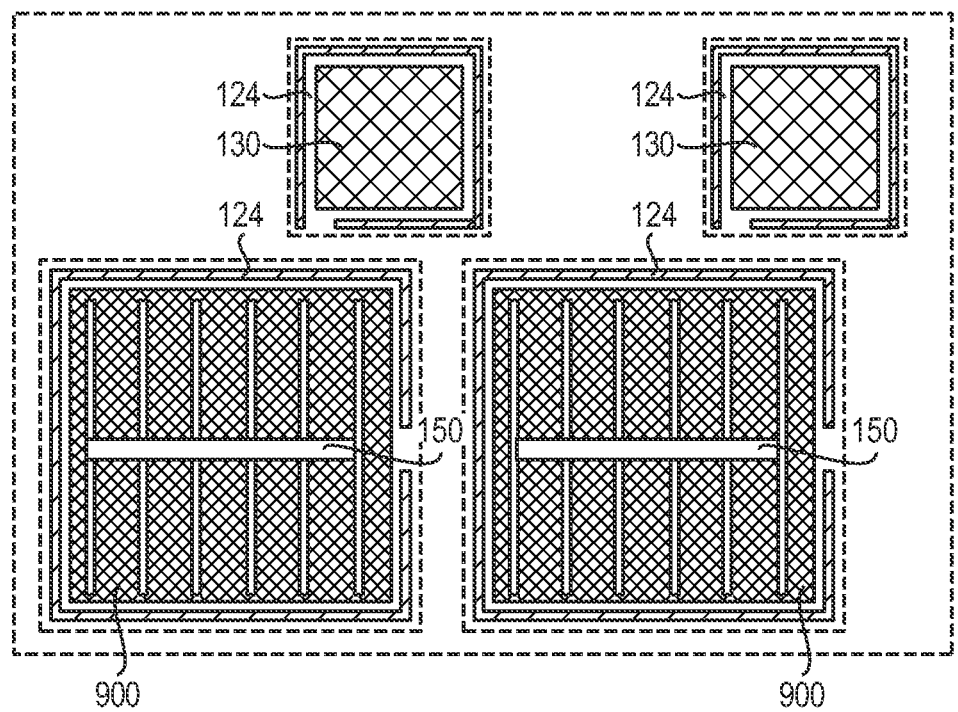

As discussed in relation to FIGS. 2A and 2B, anti-reflective coating 200 may represent only a portion of the final anti-reflective coating to be utilized on the active solar cell devices in array 100. In such embodiments, a remaining portion 900 of the anti-reflective coating may be formed (e.g., conformally deposited) over the patterned dielectric layer 700, as shown in FIGS. 9A and 9B. For example, the portion 900 may be deposited by sputtering or CVD. The portion 900 may include or consist essentially of one or more layers of any of the materials discussed above in relation to anti-reflective coating 200, e.g., silicon dioxide. As shown in FIGS. 10A and 10B, portion 900 is subsequently patterned and portions are removed where contacts (e.g., cell gridlines and contact vias) will be formed. Portion 900 may also be removed in the areas between the active cells and the bypass diodes, as shown in FIG. 10B, leaving dielectric layer 700 in such regions. Areas of portion 900 may be removed by, e.g., wet or dry etching. As shown in FIGS. 10A and 10B, in conjunction with the removal of portion 900, portions of anti-reflective layer 200 may also be removed to expose cap layer 150 where contacts will eventually be made thereto (i.e., during formation of the active cell gridlines).

Figure 11A:
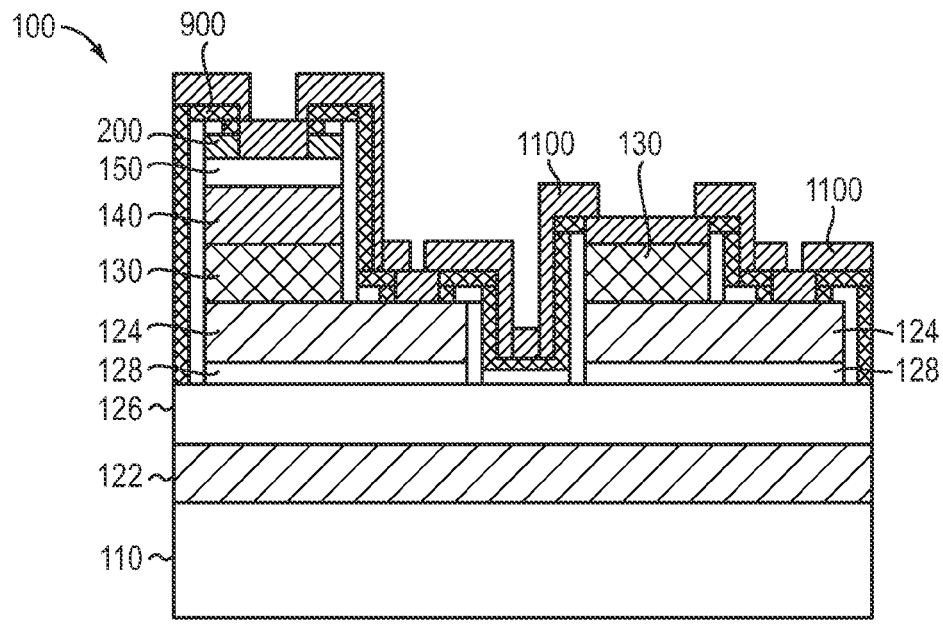
Figure 11B:
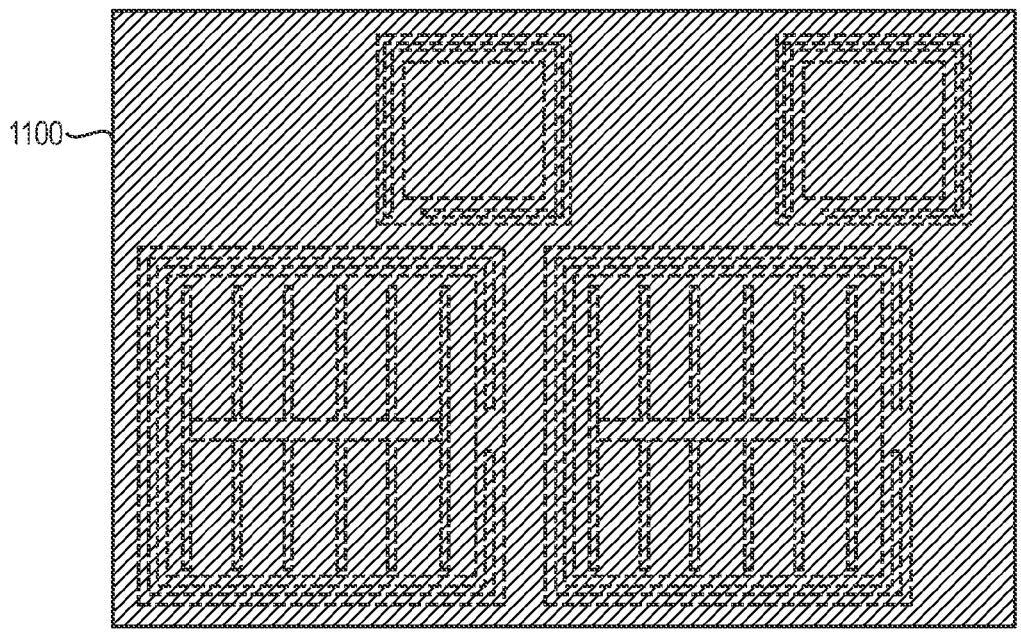

Contacts to the active solar cells and bypass diodes are provided via the reaction of at least a portion of cap layer 150 and SiGe cell 130, respectively, with a conductive material, e.g., a metal. In a preferred embodiment, and as shown in FIGS. 11A and 11B, a metal 1100 is formed over substantially all of the structures of array 100 by, e.g., sputtering, electron-beam evaporation, or CVD. The exposed surfaces of cap layer 150 and SiGe cell 130 may be cleaned prior to the formation of metal 1100 by, e.g., in-situ sputter cleaning. In preferred embodiments, the metal 1100 includes or consists essentially of a metal or metal alloy capable of forming an ohmic contact to (and via reaction with) cap layer 150 and SiGe cell 130 with a specific contact resistance of less than approximately $10^{-5}$ $\Omega$-cm$^2$, or even less than approximately $10^{-7}$ $\Omega$-cm$^2$. Metal 1100 is also preferably compatible with conventional Si microelectronics processing, i.e., does not include carrier "lifetime-killing" metals such as Au or silver (Ag). In an embodiment, metal 1100 does not include copper (Cu). In an embodiment, metal 1100 includes or consists essentially of at least one of titanium (Ti), cobalt (Co), or nickel (Ni). In other embodiments, metal 1100 includes or consists essentially of at least one of platinum (Pt), zirconium (Zr), molybdenum (Mo), tantalum (Ta), or tungsten (W).

Figure 12A:
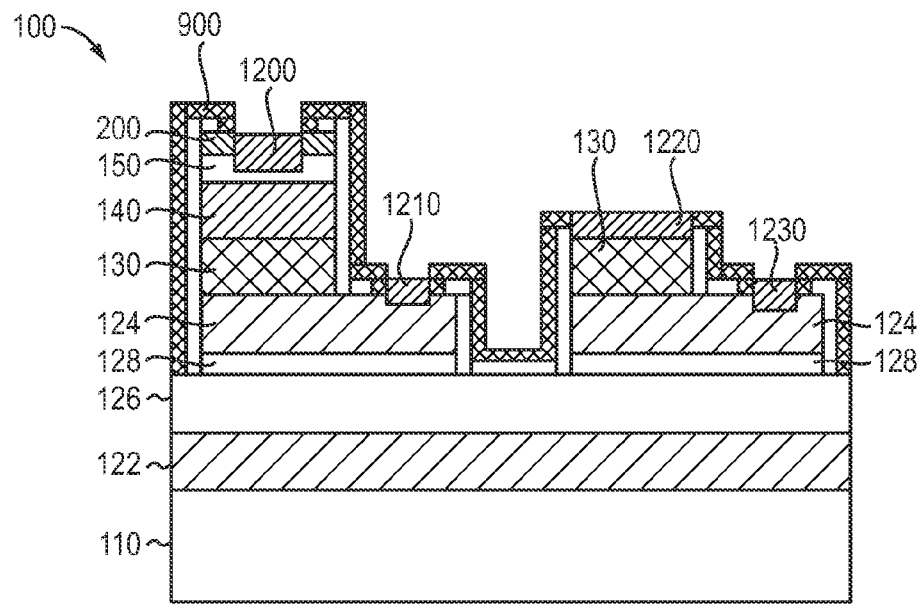
Figure 12B:
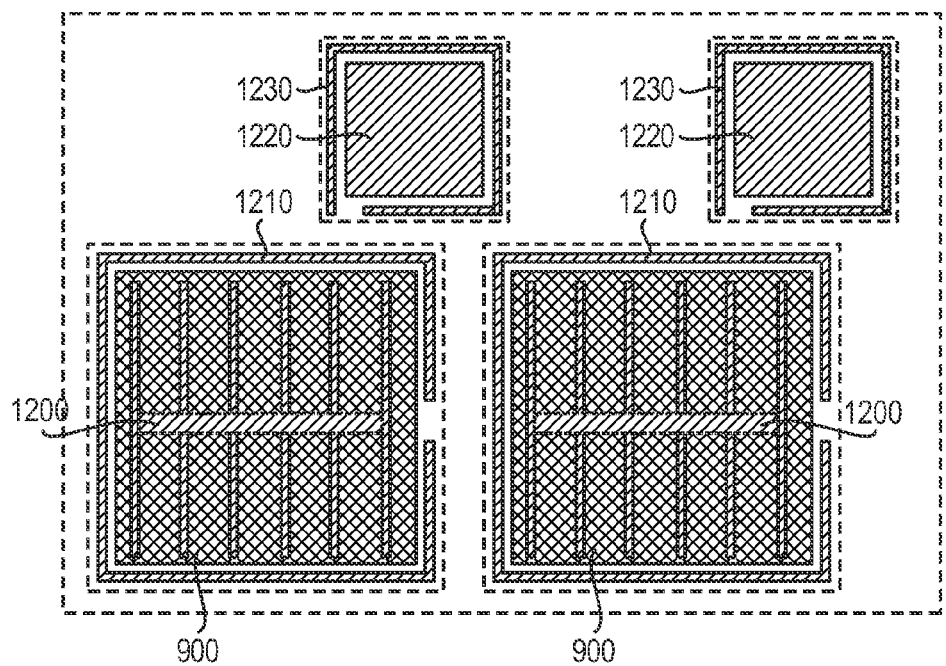

Referring to FIGS. 12A and 12B, active cell top silicide 1200, active cell bottom silicide 1210, bypass diode top silicide 1220, and bypass diode bottom silicide 1230 are formed by annealing metal 1100 at an elevated temperature, e.g., a temperature ranging from approximately 200° C. to approximately 700° C. (and in preferred embodiments, ranging from approximately 400° C. to approximately 500° C.), for a time period ranging from approximately 10 seconds to approximately 120 seconds. During the anneal, metal 1100 preferably reacts with exposed portions of cap layer 150 and SiGe cell 130, forming silicides 1200, 1210, 1220, 1230. Thus, silicides 1200, 1210, 1220, 1230 preferably include or consist essentially of a compound including elements found in cap layer 150 or SiGe cell 130 and metal 1100, e.g., a silicide or germanosilicide such as nickel silicide or nickel germanosilicide. In an embodiment, one or more of the silicides 1200, 1210, 1220, 1230 has a specific contact resistance of less than approximately $10^{-5}$ $\Omega$-cm$^2$, or even less than approximately $10^{-7}$ $\Omega$-cm$^2$. Formation of silicide 1200 may consume at least a portion of cap layer 150 thereunder; thus, an unreacted portion of cap layer 150 may be disposed beneath each silicide 1200. This unreacted portion of cap layer 150 may be thinner than portions of cap layer 150 not disposed beneath silicide 1200. As shown in FIGS. 12A and 12B, after formation of silicides 1200, 1210, 1220, 1230, the unreacted metal 1100 is removed by, e.g., selective wet etching. In a preferred embodiment wherein metal 1100 includes or consists essentially of nickel, the unreacted metal 1100 is removed via a wet etch in a solution containing $H_2SO_4$ and $H_2O_2$.

In various embodiments, the contact resistance of silicide 1200 (and even, in some embodiments, one or more of silicides 1210, 1220, 1230) may be less than approximately $10^{-8}$ $\Omega$-cm$^2$, a level lower than is generally possible using conventional metallurgical contacts to compound semiconductor materials. Thus, active cells in array 100 may have a higher efficiency than a solar cell incorporating substantially similar (or even identical) cells 130, 140 but lacking capping layer 150 (and thus utilizing standard techniques of contacting to compound semiconductor materials), as set forth in the '078 and '089 applications.

Figure 13A:
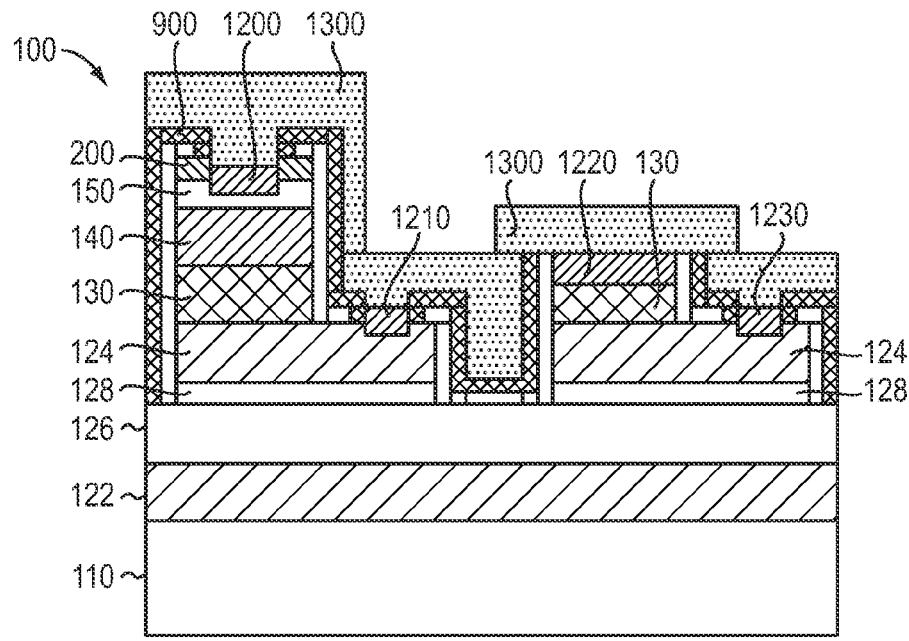
Figure 13B:
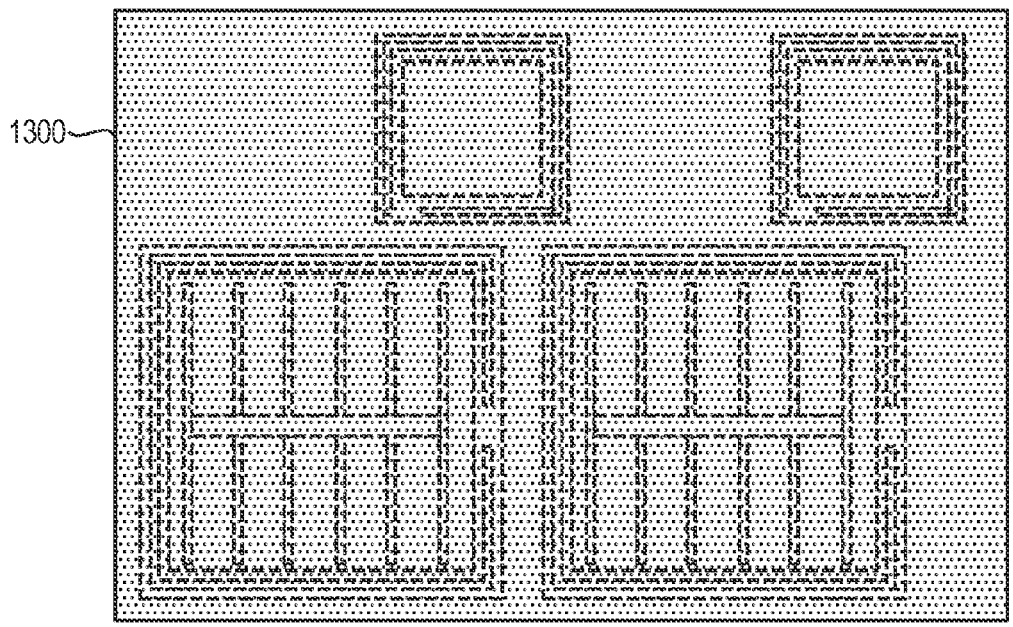
Figure 14A:
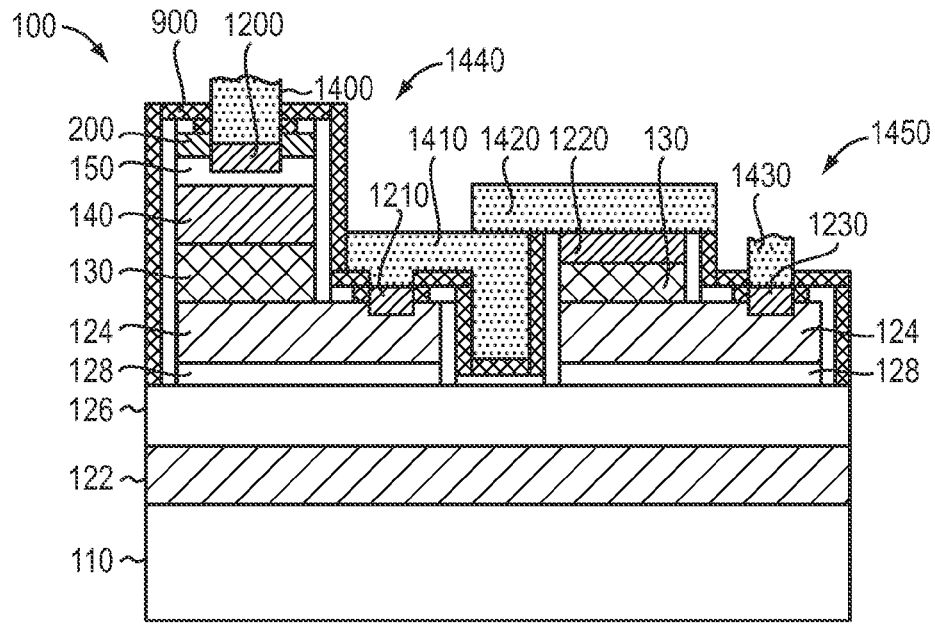
Figure 14B:
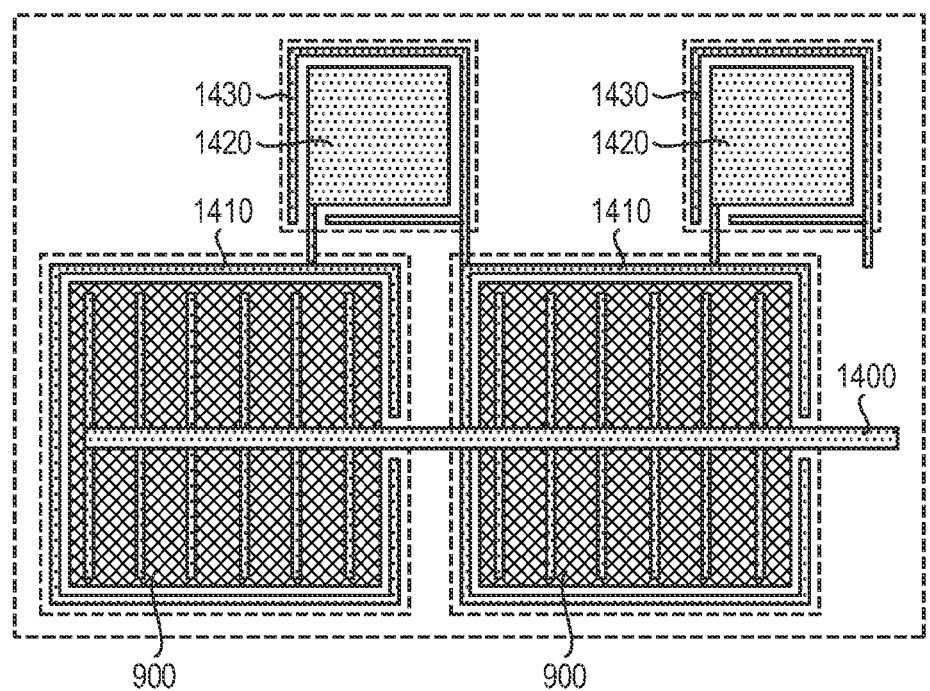

After formation of silicides 1200, 1210, 1220, 1230, the active solar cells and bypass diodes are metalized. As shown in FIGS. 13A and 13B, a conductor 1300 is formed, e.g., conformally deposited, over the structures of array 100 by, e.g., sputtering, electron-beam evaporation, or CVD. Conductor 1300 is preferably a metal or metal alloy, and may include or consist essentially of Cu or aluminum (Al). Conductor 1300 may have a thickness ranging between approximately 1 µm and approximately 5 µm. As shown in FIGS. 14A and 14B, the conductor 1300 is then patterned (by, e.g., conventional photolithographic processes) and excess portions of conductor 1300 are removed by, e.g., wet or dry etching. In a preferred embodiment in which conductor 1300 includes or consists essentially of Al, excess portions of conductor 1300 are removed via RIE with a mixture of $BCl_3$, $Cl_2$, and $CH_4$. Removal of such portions of conductor 1300 forms cell top contact 1400, cell bottom contact 1410, bypass diode top contact 1420, and bypass diode bottom contact 1430, thereby substantially completing the formation of one or more active solar cells 1440 and one or more bypass diodes 1450. As shown in FIG. 14B, in a preferred embodiment, multiple solar cells 1440 are electrically connected in series, and each bypass diode 1450 is connected in parallel between two solar cells 1440. In some embodiments, at least portions of substrate 110, graded portion 122, and uniform composition layer 126 are removed in order to enhance the electrical isolation between solar cells 1440 and/or bypass diodes 1450. Such removal is enabled by the fact that contacts 1400, 1410, 1420, 1430 are all formed on the top surfaces of the devices, rather than some contacts being formed on the bottom surface of substrate 110.

As described above, preferred embodiments of the present invention utilize SiGe cell 130 as the bypass diode 1450, rather than one of III-V cells 140 or a different, dedicated group of epitaxial layers. Since the SiGe cell 130 is generally the cell in solar cell 1440 with the smallest bandgap, it thus has the smallest reverse turn-on voltage of the various cells in solar cell 1440. (In embodiments of the invention lacking a SiGe cell 130, the bypass diode 1450 may be fabricated utilizing the lowest-bandgap III-V cell 140.) Thus, utilization of SiGe cell 130 as bypass diode 1450 limits the voltage loss in the array 100 that typically occurs when a single solar cell 1440 becomes reverse biased as the result of shading and/or other current-reducing mechanisms. The bypass diode 1450 (and hence SiGe cell 130) also need not have doping levels higher than those of the other cells in the solar cell 1440 (e.g., III-V cells 140), as such doping is not required for reasonable turn-on voltages of the bypass diode 1450; hence, the doping levels of the SiGe cell 130 and the III-V cells 140 may be substantially equal. As shown in FIGS. 14A and 14B, preferably substantially the entire exposed surface "mesa" of bypass diode 1450 is covered with metal, i.e., bypass diode top contact 1420, thereby reducing or substantially eliminating any negative contribution to the photo-induced voltage of solar cells 1440 arising from the reverse-polarity bypass diode 1450 (i.e., by blocking most or substantially all sunlight from reaching the SiGe cell 130 within bypass diode 1450).

FIGS. 14A and 14B (and the preceding figures) schematically depict an array 100 containing multiple solar cells 1440 and bypass diodes 1450 in separate areas primarily for clarity. As shown in FIGS. 15A and 15B, the bypass diodes 1450 are preferably integrated into the array 100 while still maximizing the area of the active solar cells 1440. For example, the bypass diodes 1450 may be fit within small "cut out" areas of the solar cells 1440 that otherwise consume most (or even substantially all) of the surface area of substrate 110.

Figures 16A, 16B:
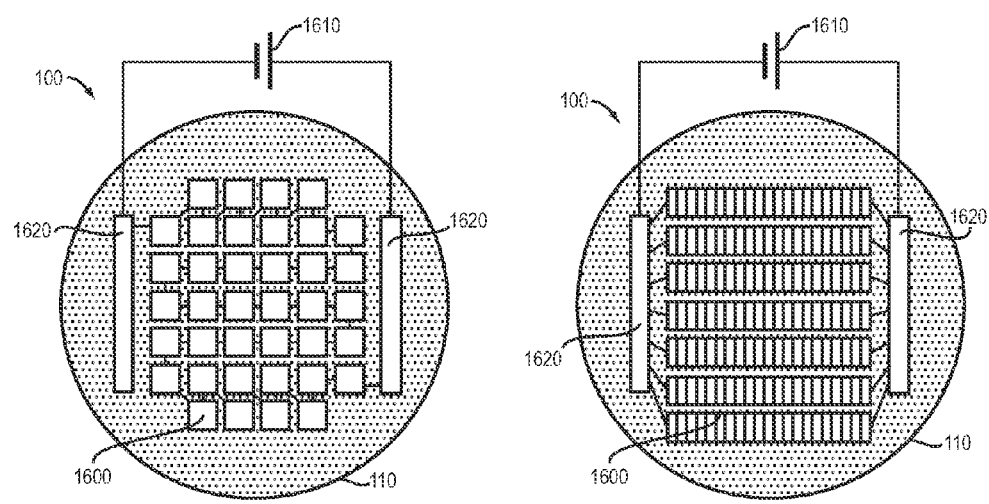
FIGS. 16A and 16B are schematic plan views of different configurations of discrete solar cells interconnected on a common substrate, in accordance with various embodiments of the invention.

FIGS. 16A and 16B depict wafer-scale views of two different interconnection schemes for unit cells 1600 connected in series on a substrate 110 and electrically connected to a load 1610 via power busses 1620. As shown, each unit cell 1600 includes or consists of a solar cell 1440, and may include a bypass diode 1450 associated therewith. (In various embodiments not all unit cells 1600 include bypass diodes 1450; rather, a bypass diode 1450 may be associated with multiple solar cells 1440.) The embodiment of FIG. 16A enables increased power delivery due to more area of substrate 110 being devoted to area of the solar cells 1440 (i.e., less area consumed by metal interconnection between unit cells 1600), and the embodiment of FIG. 16B enables parallel strings on a wafer, which enables more system redundancy. In each case the number of unit cells 1600 (and their area) may be determined by final voltage requirements of the intended application. Of course, various embodiments of the invention incorporate other possible interconnection schemes, including combinations of the two illustrated in FIGS. 16A and 16B. FIGS. 16A and 16B also illustrate that some area of substrate 110 is typically consumed by interconnection requirements. However, compared to conventional designs, less area (or even none) is consumed by interconnection between different substrates 110. Additionally, because the high-efficiency solar cells 1440 in accordance with embodiments of the present invention may be fabricated on Si substrates, the substrate area consumed by interconnections is far less costly than in traditional III-V solar cells, which are typically fabricated on germanium substrates costing more than ten times as much as silicon substrates per area.

As mentioned in reference to FIGS. 15A and 15B, the incorporation of bypass diodes 1450 may reduce the area of substrate 110 available for collection of solar energy. However, the bypass-diode area may be minimized to that enabled by metallization and lithography requirements, because the current of the bypass diode 1450 scales substantially linearly with area but substantially exponentially with the voltage across it. A typical function of the bypass diode 1450 is to sacrifice total voltage in the series-connected solar cells 1440 in cases where a single cell 1440 would otherwise limit the total current in the string (i.e., to thus maximize string power output). Therefore, trading reduced current from a small-area bypass diode 1450 is generally acceptable because the corresponding increase in voltage drop is comparatively small. The concept is illustrated in FIG. 17, which tabulates the results of a SPICE (Simulation Program with Integrated Circuit Emphasis) circuit simulation of the impact of bypass-diode area on the peak output power of a series connection of ten high-efficiency solar cells 1440 experiencing partial shading. In this case, a single cell 1440 of the ten-cell string experiences a photo-current reduction of 50% compared to the other nine cells. As shown, the use of bypass diodes 1450 in general greatly mitigates the loss of power in the event of cell photo-current loss. Furthermore, the scaling of the area of the bypass diode 1450 to an area of only approximately 1% of that of the cell 1440 itself still provides a power-saving benefit similar to using integrated bypass diodes 1450 each with an area equal to that of a solar cell 1440.

In various embodiments, fabricating one or more unit cells 1600, or even each unit cell 1600, with a bypass diode 1450 does not significantly increase the complexity of the fabrication process and enhances the reliability of each string in the array 100. Conventional solar panels are typically fabricated with discrete (i.e., separate and hard-wired) bypass diodes across sets of cells in a series string due to the complexity adding additional external components between each wafer in the wiring process. In other words, the loss of a cell in a conventional solar panel due to the previously discussed current-reducing mechanisms (e.g., shading or physical damage) often means the loss of photo-voltage of several cells, rather than of a single cell. Embodiments of the present invention with integrated bypass diodes 1450 limit the voltage loss due to the failure of single cell 1600 to the voltage that would have otherwise been generated by that particular cell 1600. Additionally, because the diodes 1450 are generally fabricated monolithically on the same substrate 110 as the high-efficiency solar cells 1440, the complexity, cost, and weight of the final array 100 is reduced.

Figure 18:
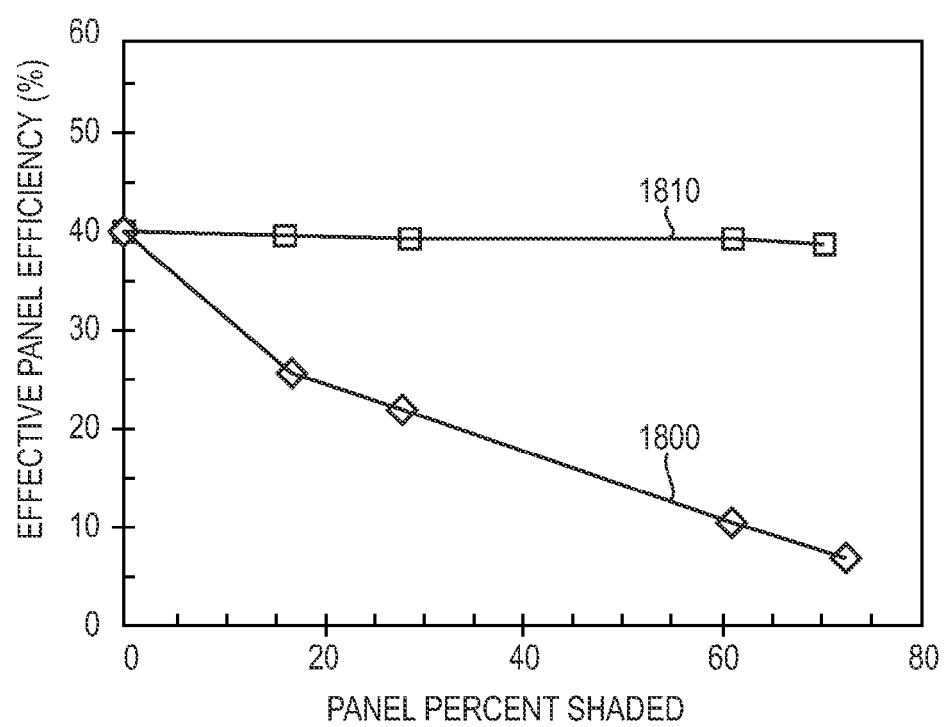
FIG. 18 is a graph of effective panel efficiency as a function of percent shading, comparing an embodiment of the present invention with a conventional solar panel.

A SPICE simulation similar to that described above was performed in order to compare the performance of an array 100 (with integrated bypass diodes 1450) to that of a traditional high-efficiency solar panel under partial shading scenarios. The constraints of the simulation assumed the same high-efficiency unit solar cell capable of achieving 40% efficiency under AM0 illumination and an open-circuit voltage of 3.2 volts. The final panel configuration was designed to operate at 265 volts and occupy an area of approximately 2×5 meters. The traditional panel configuration is composed of small-diameter substrates (assumed here to be square cells cleaved from industry standard three-inch wafers) configured in series-connected strings of 90 cells and 40 complete strings to fill the panel area. The configuration of arrays 100 in accordance with embodiments of the present invention is composed of smaller unit cells 1600 that occupy a large-diameter (e.g., eight-inch) Si substrate 110. These unit cells 1600 are connected in series strings of 90 on each substrate 110 to produce the same operating voltage as the traditional panel and then tiled in parallel to occupy the same physical area. Under uniform AM0 illumination, both panel configurations produce an identical 5 kW of power. However, under scenarios where a portion of the panel area is completely shaded from illumination, the total peak output power of each panel configuration differs considerably. FIG. 18 summarizes the calculated effective panel efficiency as a function of the percentage of the total panel area that is completely shaded from illumination. Effective panel efficiency is defined as the calculated peak panel output power divided by the cumulative incident power, and FIG. 18 depicts the effective panel efficiency 1800 for the conventional panel and the effective panel efficiency 1810 for the array in accordance with embodiments of the present invention. FIG. 18 indicates that embodiments of the present invention greatly outperform the traditional panel configuration under partial shading, and substantially match the intrinsic cell efficiency independent of the particular shading scenario. In contrast, the traditional panel configuration produces a peak output power that falls off rapidly as a greater percentage of the series strings within the panel become shaded.

An additional benefit of various embodiments of the invention is the ability to include active electronics on substrate 110 as part of the fabrication process. In conventional solar panels, peak-power trackers are employed to dynamically adjust the operating point of series-connected solar cells so that they operate closer to their peak power point. The simulations described above assume that maximum power produced by the panel is entirely delivered to the load. However, the panel voltage and current at the peak-power point may substantially vary based on changes in total isolation, partial shading, and temperature. Thus, peak-power trackers may be employed to dynamically change the load presented to the panel in order to extract maximum power for the current conditions.

Figure 19:
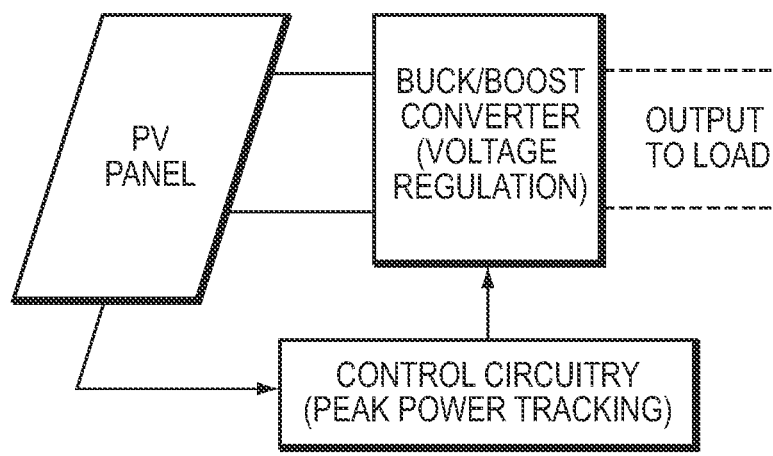
FIG. 19 is a schematic block diagram of a peak-power tracking system in accordance with various embodiments of the invention.

FIG. 19 illustrates a typical methodology employed with peak-power-tracking approaches. Such peak-power trackers are fabricated with external electronics that add complexity and weight to the final panel assembly. The general approach depicted in FIG. 19 may summarized as the combination of voltage regulation with control circuitry that monitors the operating behavior of the complete panel. The voltage regulation is often realized as a step-up or step-down (i.e., boost/buck) DC/DC converter. Approaches for the implementation of the control circuitry may include hill-tracking, fuzzy logic, and neural-network-based methods. The complexity of the chosen approach must typically balance the tradeoff between the power consumed in the tracking circuit and the potential power that can be gained from the photovoltaic array without tracking.

Figure 20A:
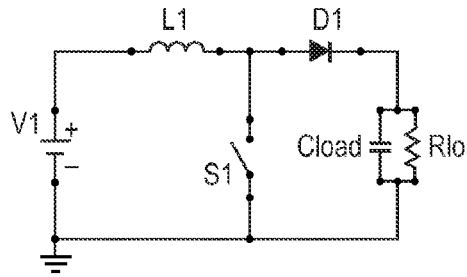
FIGS. 20A, 20B, and 20C are circuit diagrams of boost and buck converter topologies that may be implemented in accordance with various embodiments of the invention.
Figure 20C:
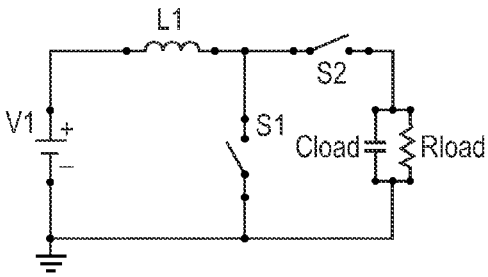
Figure 20B:
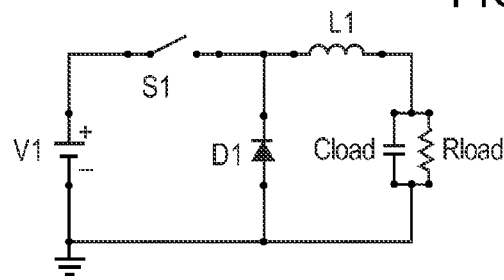

As mentioned above, maximum power-point tracking (MPPT) for solar arrays may be implemented using a switching DC-DC converter circuit, such as boost (step-up) converter, buck (step-down) converter, or boost-buck converter, depending at least in part on the difference between the voltages required for the solar array and the load. FIGS. 20A, 20B, and 20C depict typical boost and buck converter topologies that may be implemented in embodiments of the present invention; FIG. 20A depicts a boost converter with a rectifying diode D1, FIG. 20B depicts a buck converter with a rectifying diode D1, and FIG. 20C depicts a boost converter with an additional switching element S2. These types of DC/DC converters all operate by charging and discharging an inductive component to step up or step down the input voltage as desired, with the magnitude of the step-up or step-down ratio being controlled by the duty cycle of the switching component. Various DC-DC conversion schemes use a diode to rectify the AC component of the resulting waveform. For higher efficiency, however, the diode may be replaced with another switching element (e.g., a transistor) to avoid power dissipation due to the forward voltage drop of the diode (as shown in FIG. 20C). In this configuration, the transistor that replaces the diode is switched on when the charging transistor is switched off, effectively mimicking the operation of the diode with significantly less effective resistance. The size of the charge-storage components in the circuit may be determined in view of a number of considerations, including the typical operating voltage and current of the array, the switching frequency, the desired dynamic range of the converter, and the ripple requirements of the resulting output signal.

Figure 21:
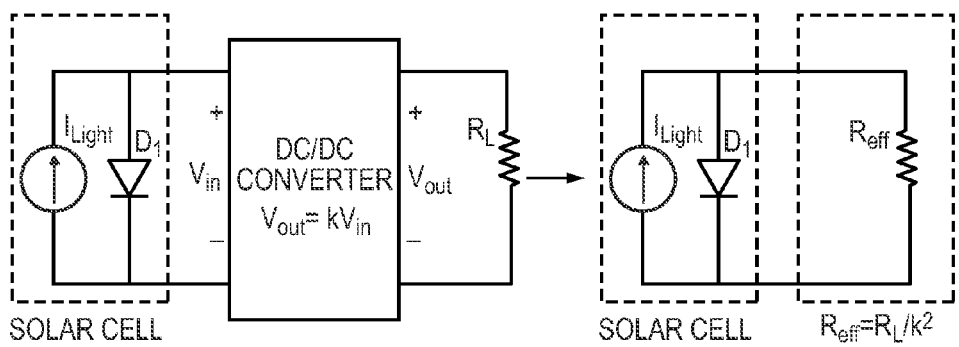
FIG. 21 schematically depicts the equivalent load resistance experienced by a solar cell connected to a resistive load via a DC/DC converter in accordance with various embodiments of the invention.

The DC/DC converter typically alters the effective load of the solar array, thereby changing the operating voltage of the array to maintain it at peak power. An ideal DC/DC converter may be the DC equivalent of a variable-ratio transformer, in that the voltage on the output is equal to the voltage on the input multiplied by a given ratio k, while the current is divided by that same ratio. FIG. 21 schematically depicts the equivalent load resistance $R_{\it eff}$ experienced by a solar cell connected to a resistive load via a DC/DC converter. Because input and output power of the ideal DC/DC converter are the same, and $V_{out}=kV_{in}$, the effective resistance observed by the solar array may be calculated via the equations below.

$$\frac{V_{in}^2}{R_{\it eff}} = \frac{V_{out}^2}{R_L} = \frac{(kV_{in})^2}{R_L}$$

$$R_{\it eff} = \frac{R_L}{k^2}$$

Figure 22:
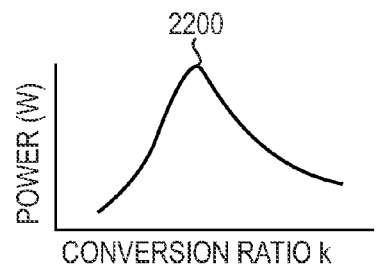
FIG. 22 is an illustrative graph of the power output as a function of conversion ratio selected during a maximum power-point tracking technique in accordance with various embodiments of the invention.

Since the input/output ratio k of the switched DC/DC converter is typically variable, adjusting k by adjusting the duty cycle of the switching transistor(s) adjusts the value of $R_{\it eff}$, which in turn changes the output power of the solar array, as shown in FIG. 22. The output of the solar cell may therefore be maximized by dynamically selecting the correct k ratio to obtain a maximum power 2200.

Figure 23:
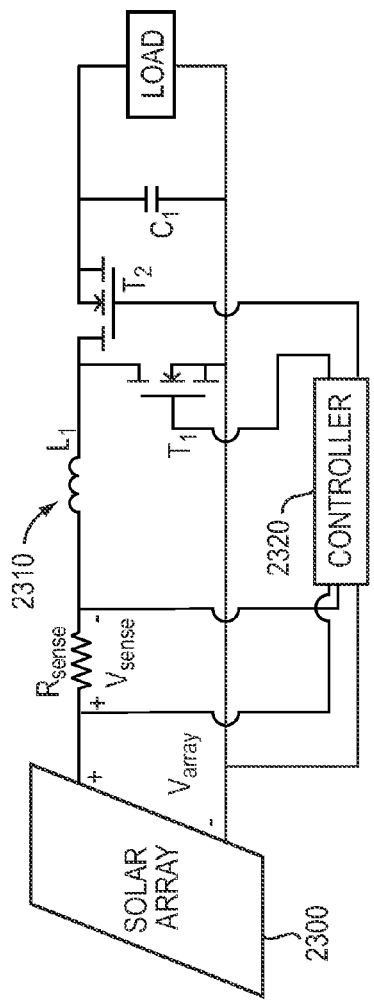
FIG. 23 is a schematic circuit diagram of a maximum power-point tracking system integrated with a solar array in accordance with various embodiments of the invention.

FIG. 23 depicts a typical connection setup for an MPPT system that includes a solar array 2300, a DC/DC converter 2310, and control electronics 2320. Any of a variety of control algorithms may be used to regulate the duty cycle of the switching converter 2310, some involving different circuit elements. However, in many embodiments of the present invention, the controller block of the circuit has the voltage and current of the array as inputs, and outputs a square wave with a variable duty cycle as an output. For the first three digital methods described below, the algorithms may be implemented in the firmware of a microcontroller, with little to no change in hardware. Generally, embodiments of the present invention may incorporate any of the MPPT methods described in T. Esram and P. Chapman, "Comparison of Photovoltaic Array Maximum Power Point Tracking Techniques," IEEE Transactions on Energy Conversion, Vol. 22, No. 2, pp. 439-449 (June 2007), the entire disclosure of which is incorporated by reference herein, some of which are described below.

One algorithm for MPPT that may be utilized with various embodiments of the present invention is the perturbation and observation method. The perturbation and observation method generally involves regularly making a small, incremental change in the duty cycle of the pulse-width modulated (PWM) control signal for the DC/DC converter (and hence the operating voltage), and then observing the resulting change in output power. If the change in the magnitude of the output power is positive, the next increment occurs in the same direction, and if it is negative, the next increment occurs in the opposite direction. The result of this behavior is that the operating voltage drifts towards the maximum power point, then oscillates around it. One advantage of this method is that the solar array remains continuously connected to the load without significant disruption.

Another method utilized in embodiments of the present invention is the proportional $I_{sc}/V_{oc}$ method. The proportional $I_{sc}$ method is enabled by the fact that for a uniformly illuminated solar array with known parasitic resistances, the maximum power point may be calculated in relationship to either the short-circuit current or open-circuit voltage of the array. In order to obtain a value for the short-circuit current $I_{sc}$, the array may be periodically short circuited (by, e.g., closing T1 in FIG. 23 and allowing the current to settle), while to measure the open-circuit voltage $V_{oc}$, the circuit may be opened (by, e.g., opening both T1 and T2 in FIG. 23). Advantages of this method include its computational simplicity, its requirement of fewer sense inputs, and it being less prone to instability.

Another MPPT technique utilized in embodiments of the present invention is the I-V sweep method. The I-V sweep method generally operates by periodically sweeping the duty cycle across the range where the MPPT occurs, and then setting the operating voltage of the array at the maximum power point until it is time to sweep again. One advantage of this method is its capability of distinguishing between local and global power maxima in cases where the array is not uniformly illuminated.

Figure 24:
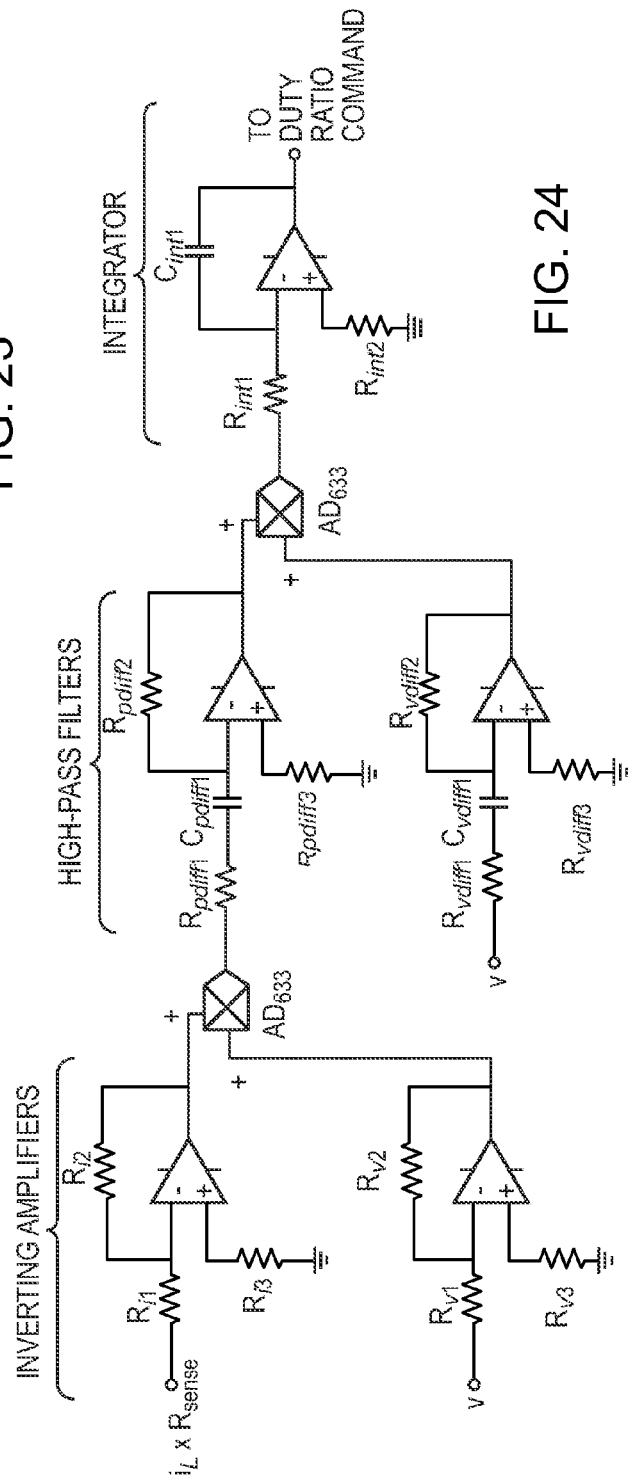
FIG. 24 is a circuit diagram of an analog-control implementation for the ripple correlation maximum power-point tracking technique in accordance with an embodiment of the invention.

Finally, another MPPT method utilized in embodiments of the present invention is the ripple correlation method. This method involves oscillating the frequency of the PWM signal around the given setpoint and observing if the resultant change in output power is in phase or out of phase with the oscillating signal. The setpoint of the PWM signal is then increased or decreased depending on this comparison. One advantage of this method is that it may be implemented entirely using analog components, and as such is simpler from a lithography perspective. One analog control circuit implementation for the ripple correlation method in accordance with an embodiment of the invention is shown in FIG. 24.

Figures 25A, 25B:
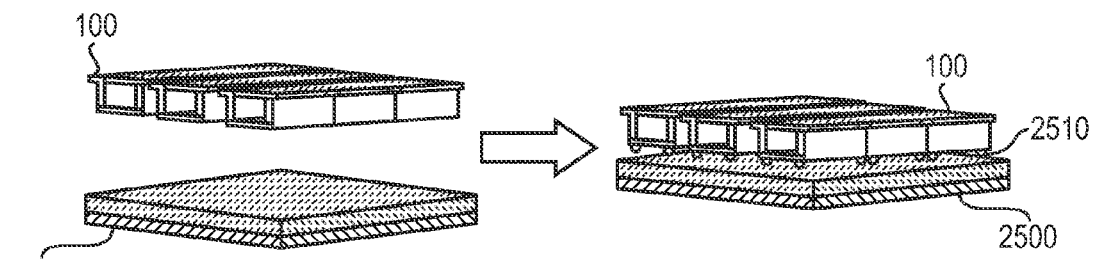
FIGS. 25A and 25B schematically depict the integration of various electronics with solar-cell arrays via substrate bump bonding in accordance with various embodiments of the invention.

One method of utilizing active electronics for peak-power tracking in embodiments of the present invention is depicted in FIGS. 25A and 25B, which illustrate the combination of a substrate 2500 containing control circuitry (e.g., CMOS control circuitry) with an array 100 including high-efficiency solar cells 1440 with integrated bypass diodes 1450. The array 100 may be mated via bump-bonding (with bump bonds 2510) with the substrate 2500 that may be separately fabricated in, e.g., a conventional silicon CMOS fabrication facility.

Figure 26:
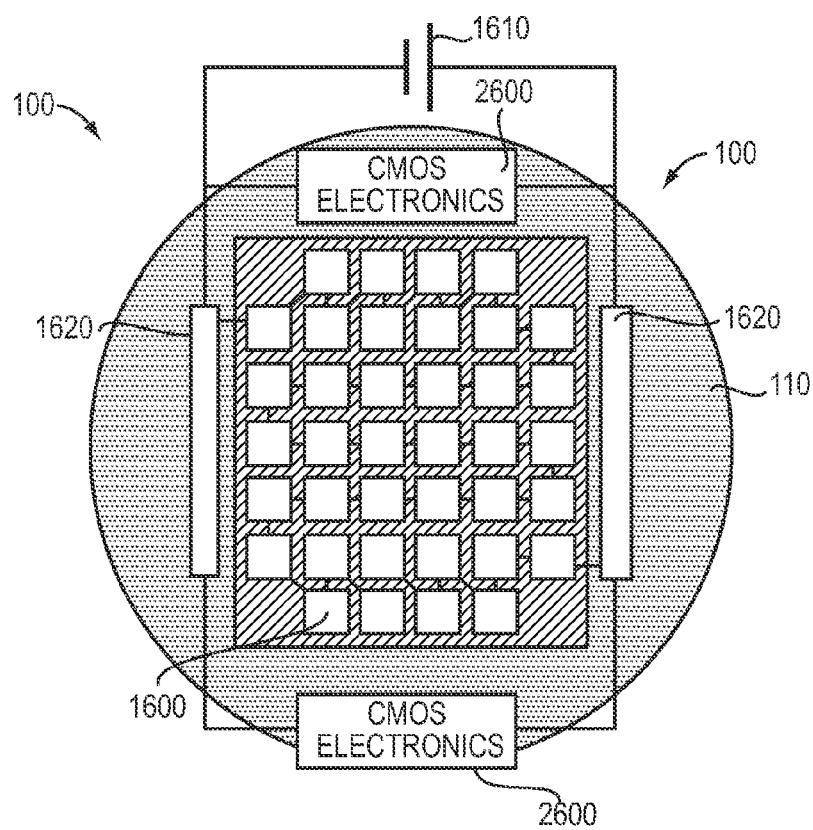
FIG. 26 is a schematic diagram of various electronics monolithically integrated with an array of discrete solar unit cells on a substrate in accordance with various embodiments of the invention.

An additional method to combine control circuitry for MPPT with a solar-cell array 100 is the monolithic fabrication of such circuitry 2600 on the same substrate 110 as the array of solar-cell unit cells 1600. In various embodiments of this monolithic approach (illustrated in FIG. 26), a substrate 110 (that may contain a lattice-matched growth template for III-V material, as described above) is inserted into the silicon fabrication sequence. First, peripheral silicon transistors are fabricated, a process that may utilize temperatures higher than those tolerable by III-V cells 140, and then the III-V cells 140 are epitaxially grown and processed in areas opened to expose the template (and/or SiGe cell 130). The cells 1440 are fabricated and then silicon back-end interconnect technology may be used to monolithically integrate the devices together and with the MPPT circuitry 2600.

Figure 27:
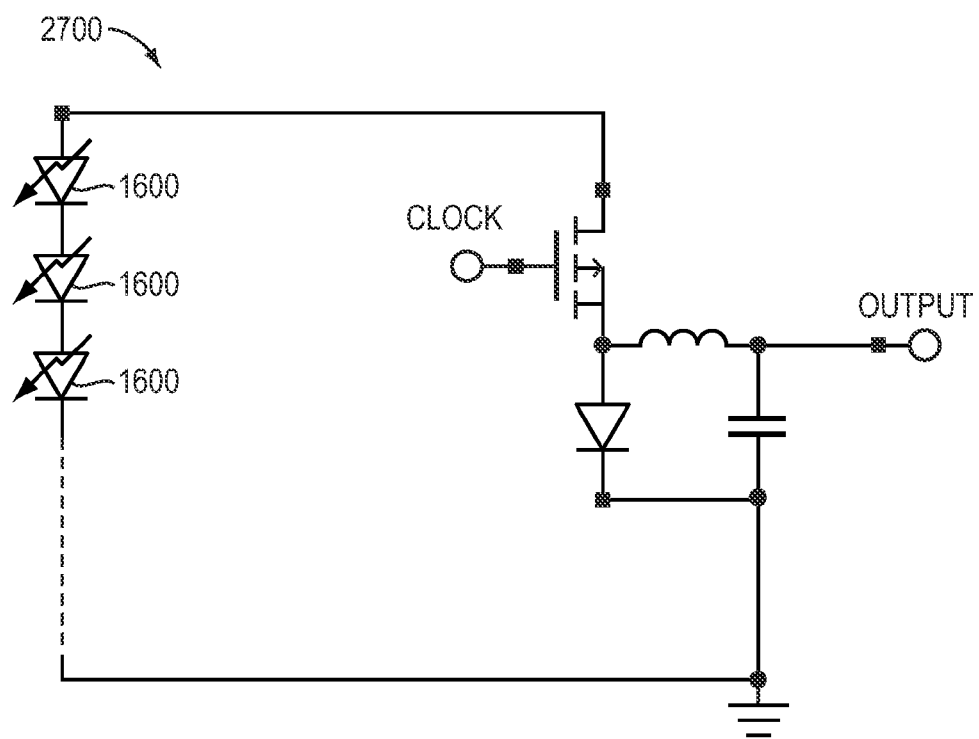
FIG. 27 is a circuit diagram of an on-wafer maximum power-point tracking system in accordance with various embodiments of the invention.

An exemplary circuit implementation 2700 for on-wafer MPPT in accordance with an embodiment of the invention is illustrated in FIG. 27. In some implementations, peak-power tracking forgoes the implementation of complex control circuitry and only regulates at the panel output. For panels operating at high voltages and current, this typically requires large charge-storage elements and high-power electronics. In accordance with various embodiments of the invention, the power tracking and voltage regulation is divided across smaller subsections of the array 100. FIG. 11 illustrates a switched buck converter connected to partial strings (e.g., each containing multiple unit cells 1600) within the array 100.

Figure 28:
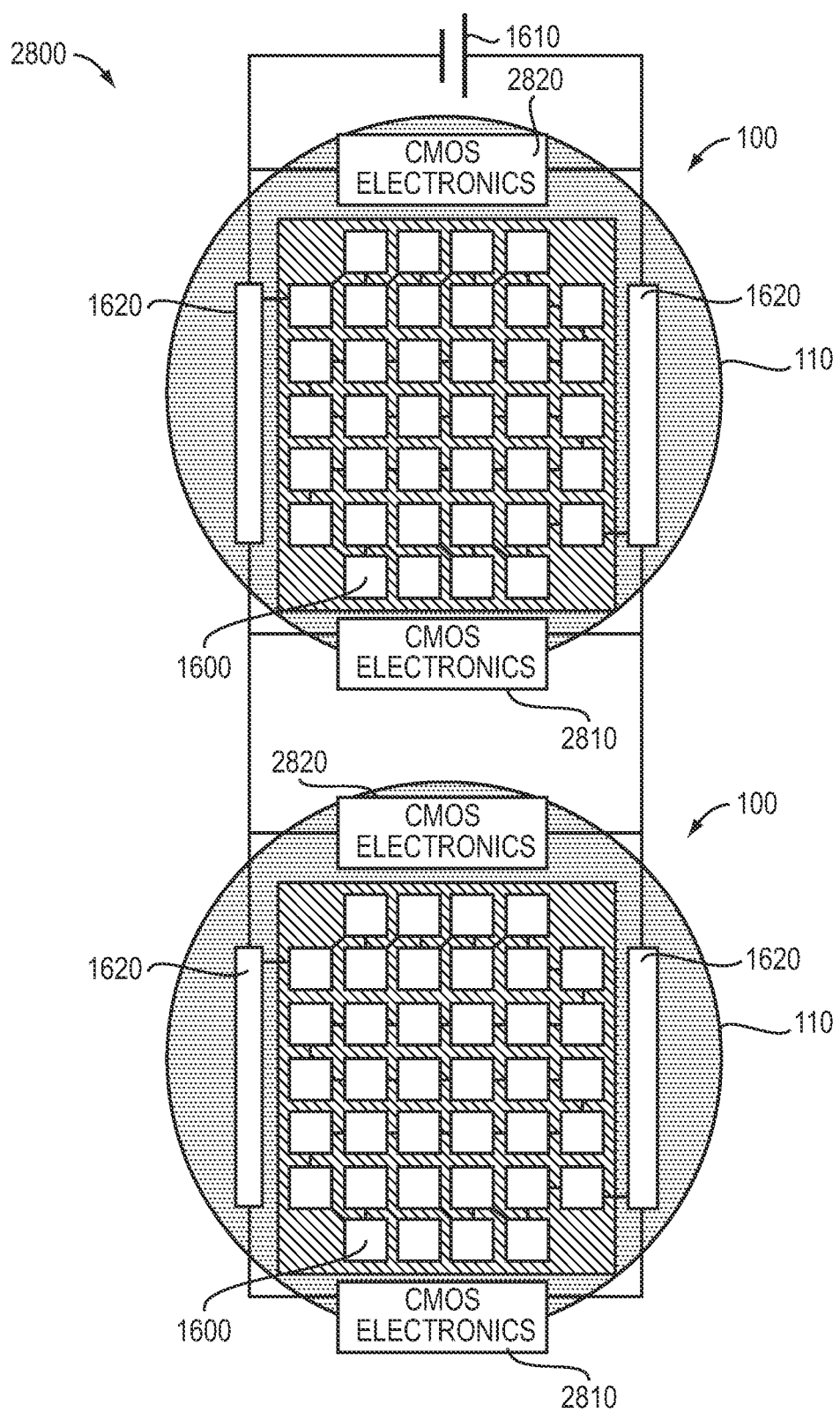
FIG. 28 schematically depicts multiple on-wafer solar arrays electrically interconnected and connected to a common load in accordance with various embodiments of the invention.

FIG. 28 depicts a solar array system 2800 in accordance with various embodiments of the present invention that outputs a regulated output voltage. As shown, system 2800 includes two parallel-connected solar arrays 100, each including or consisting essentially of one or more series-connected strings of unit cells 1600 fabricated on a substrate 110. Preferably each of the unit cells 1600 includes or consists essentially of a solar cell 1440 and an associated bypass diode 1450, as described above. Although system 2800 is depicted as including only two arrays 100, typically a system 2800 will include more than two arrays 100 electrically connected in parallel. As shown, the parallel connected arrays 100 are typically connected to a load 1610, e.g., an electrical grid.

As detailed above, each array 100 preferably includes a first DC/DC converter stage 2810 monolithically integrated on the substrate 110; first stage 2810 maintains the array 100 at its maximum power point via MPPT, e.g., any of the MPPT techniques described above. System 2800 will operate to generate power under solar illumination with each array 100 having only a first stage 2810 enabling MPPT; however, the output of the system 2800 may settle at an unregulated output voltage delivered to load 1610, which may be unacceptable for some applications. Thus, in some embodiments, each array 100 also includes a second DC/DC converter stage 2820, different from the first stage 2810, that regulates the output of the array 100 at a fixed voltage, thereby enabling the delivery of a uniform, desired voltage to the load 1610. While the second stage 2820 is shown in FIG. 28 as being at a distinct and different location on the substrate 110 than the first stage 2810 (e.g., separated by the plurality of unit cells 1600), the discrete first and second stages 2810, 2820 may be fabricated at the same location on the substrate 110.

In many embodiments of the present invention, monolithically integrated on-substrate electronics include DC/DC converter circuits, e.g., for MPPT, that step up and/or step down the voltage of the array 100 of solar cells 1440 (or unit cells 1600) by a desired amount, as detailed above, and such converter circuits typically incorporate charge-storage elements (e.g., inductors and/or capacitors). In some embodiments, the resulting output waveform of the array 100 may still incorporate a small "ripple," i.e., an AC component, arising from the DC/DC conversion. The size of the ripple may be influenced (at least in part) by the capacitance and/or inductance in the converter circuit, with larger capacitances and/or inductances generally leading to smaller ripples and hence more stable output waveforms.

Figure 29A:
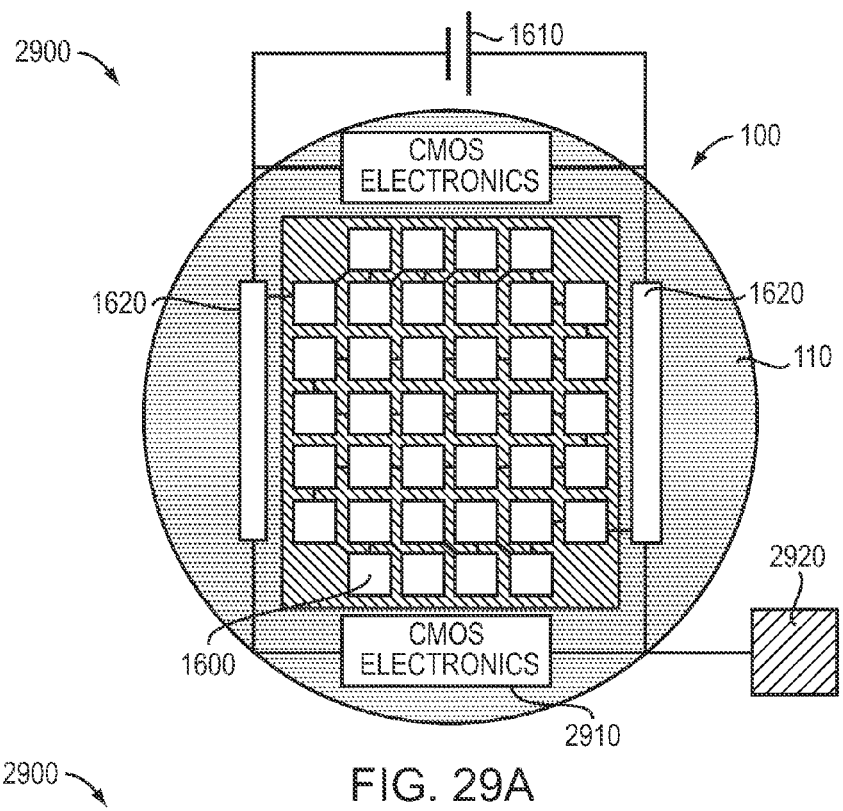
FIGS. 29A and 29B are, respectively, a schematic plan view and a schematic cross-section of solar-cell arrays on a substrate featuring electronics having off-substrate or substrate-backside-mounted charge-storage elements in accordance with various embodiments of the invention.
Figure 29B:
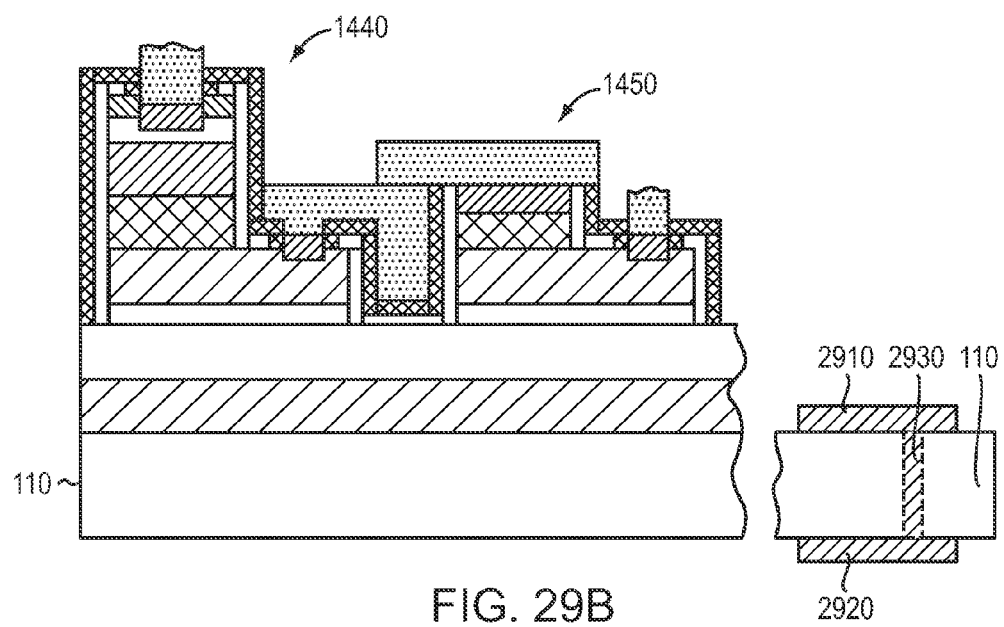

Many applications for which an array 100 (or a system incorporating multiple arrays 100) may be utilized demand extremely stable power waveforms. Formation of such waveforms may be facilitated by utilization of charge-storage elements larger than may be practically fabricated on the top surface of the substrate 110 with the remaining conversion circuitry (e.g., in order to devote the majority of the substrate area to the multiple discrete solar cells for increased solar collection). FIGS. 29A and 29B schematically depict two such systems 2900, in which DC/DC conversion circuitry 2910 is formed on substrate 110 with the unit cells 1600 but also electrically connected to one or more charge-storage elements (e.g., capacitors and/or inductors) 2920 disposed off of the top surface of substrate 110. Thus, conversion circuitry 2910 may not include any charge-storage elements, or may include only charge-storage elements of insufficient capacitance and/or inductance (and/or size) to produce an output waveform of desired smoothness. As shown in FIG. 29A, the charge-storage element(s) 2920 may be linked to circuitry 2910 via one or more wires, and the element(s) 2920 may be disposed on a larger frame, or inside a larger module, that houses multiple systems 2900 (each including or consisting essentially of one or more arrays 100 each on a different substrate 110). As shown in FIG. 29B, the charge-storage element(s) 2920 may even be disposed on the back surface of the substrate 110, the surface area of which may be consumed by such elements without compromising the solar-collection ability of the system 2900. Such elements 2920 may even be electrically connected to circuitry 2910 by one or more vias 2930 formed through the thickness of the substrate 110 (or that wrap around an edge of the substrate 110). External charge-storage elements 2920 may even be electrically connected to circuitry 2910 via bump bonding of a separate substrate incorporating the elements 2920, as depicted in FIGS. 25A and 25B. In order to improve electrical isolation of particular portions of circuitry 2910 (e.g., switching elements such as transistors) from the large voltages produced by the rest of array 100, the substrate 110 may even include therein or thereon an insulator layer (e.g., silicon dioxide), as mentioned above.

As described above, solar arrays and systems in accordance with various embodiments of the present invention incorporate, on a single substrate (e.g., a semiconductor substrate such as silicon), multiple discrete and interconnected solar cells (each with or without a dedicated bypass diode) and monolithically integrated electronics for, e.g., MPPT to maximize performance of the system (which may incorporate several such "solar panels on wafer" electrically connected together, e.g., in parallel), particularly in cases where the performance of one or more unit cells is compromised by, e.g., shading or physical damage. Embodiments of the invention extend this ability of the solar-array system to react to such performance-compromising events by making each on-substrate array dynamically reconfigurable in response to changing external conditions. Such embodiments include, on the substrate, switching elements (e.g., CMOS switching elements such as transistors) in order to dynamically reconfigure the on-wafer array. In some embodiments, such reconfigurability even enables MPPT without the need for charge-storage elements and their associated weight and cost. As described above, in typical MPPT techniques, DC/DC conversion steps utilize passive charge-storage elements (i.e., capacitors and/or inductors) in order to perform the conversion. However, this conversion may not be needed if the output voltage and current of the array itself may be changed dynamically in response to changing external conditions. Embodiments of the invention incorporate reconfigurability by adding electronic control to individual unit cells on the substrate. For example, in response to lower output current resulting from reduced insulation, some cells may be shifted out of series strings in order form a new parallel string (at the cost of lower voltage). Or, in response to lower output voltage resulting from increased ambient temperature, cells may be moved out of parallel strings and connected in series (at the cost of lower current).

Figure 30:
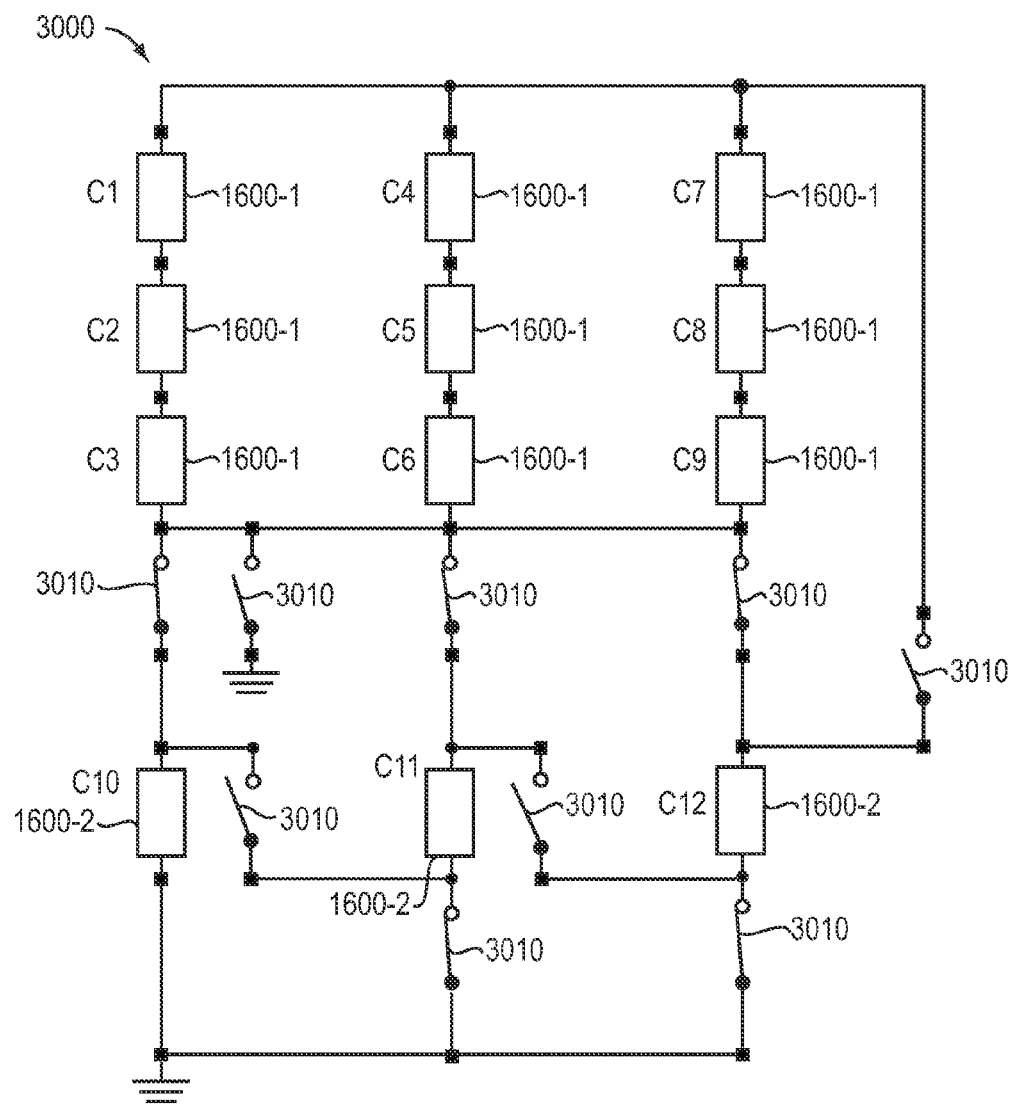
FIG. 30 is a schematic circuit diagram of a partially reconfigurable solar-cell array fabricated on a common substrate in accordance with various embodiments of the invention.

In one embodiment of the present invention, the majority of unit cells 1600-1 on a substrate 110 are arranged in the configuration (described above) of series-connected strings which are then tiled in parallel on the substrate 110. In addition, a smaller subset of unit cells 1600-2 is available to switch between series and parallel configurations depending on the particular load requirements and/or the ambient conditions. For example, FIG. 30 illustrates a configuration 3000 where switching elements 3010 are incorporated into an array 100 of unit cells 1600-1, 1600-2 to reconfigure a 4×3 array into a 3×4 array. Decisions about the configuration of the array may be made via monitoring of small "pilot" cells 1600 on the substrate 110, and switching may be controlled by simple logic circuitry (not shown). Because the time scale of various changing solar conditions (e.g., passing clouds, setting sun, etc.) is long compared to the switching speed of control circuitry (which switches in the, e.g., kHz to MHz regime), such configuration changes may be made in real time.

Figure 31:
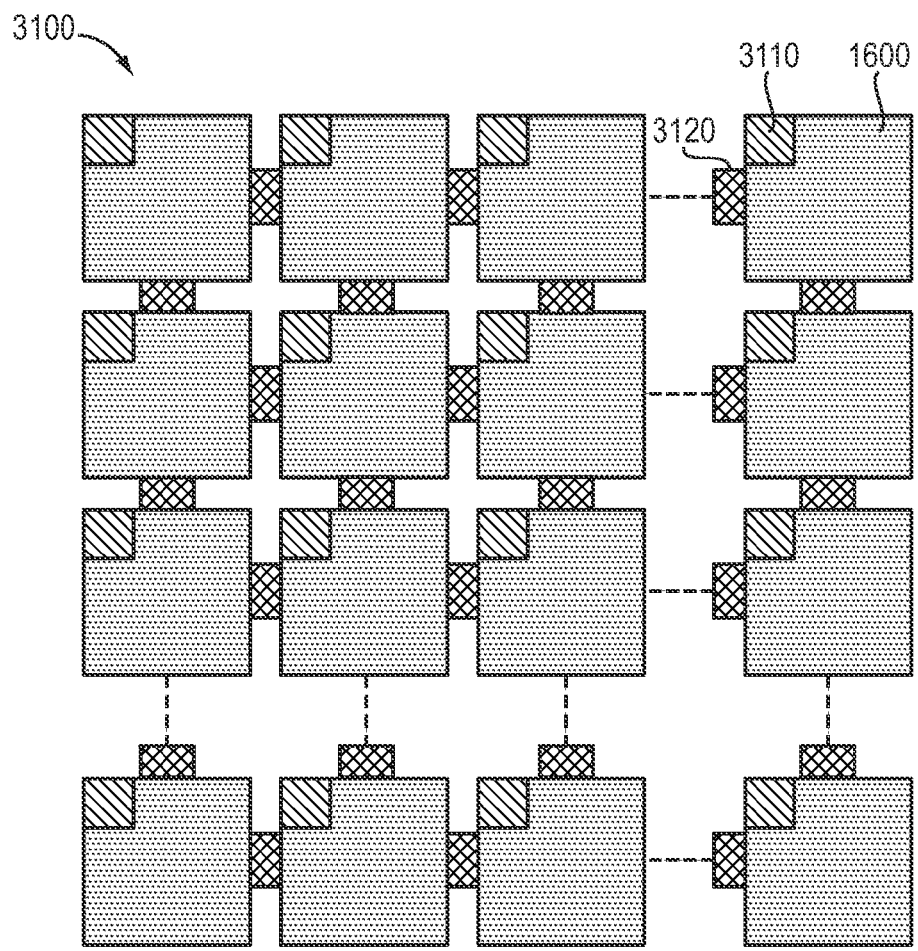
FIG. 31 is a schematic diagram of a fully reconfigurable solar-cell array fabricated on a common substrate in accordance with various embodiments of the invention.
Figure 32:
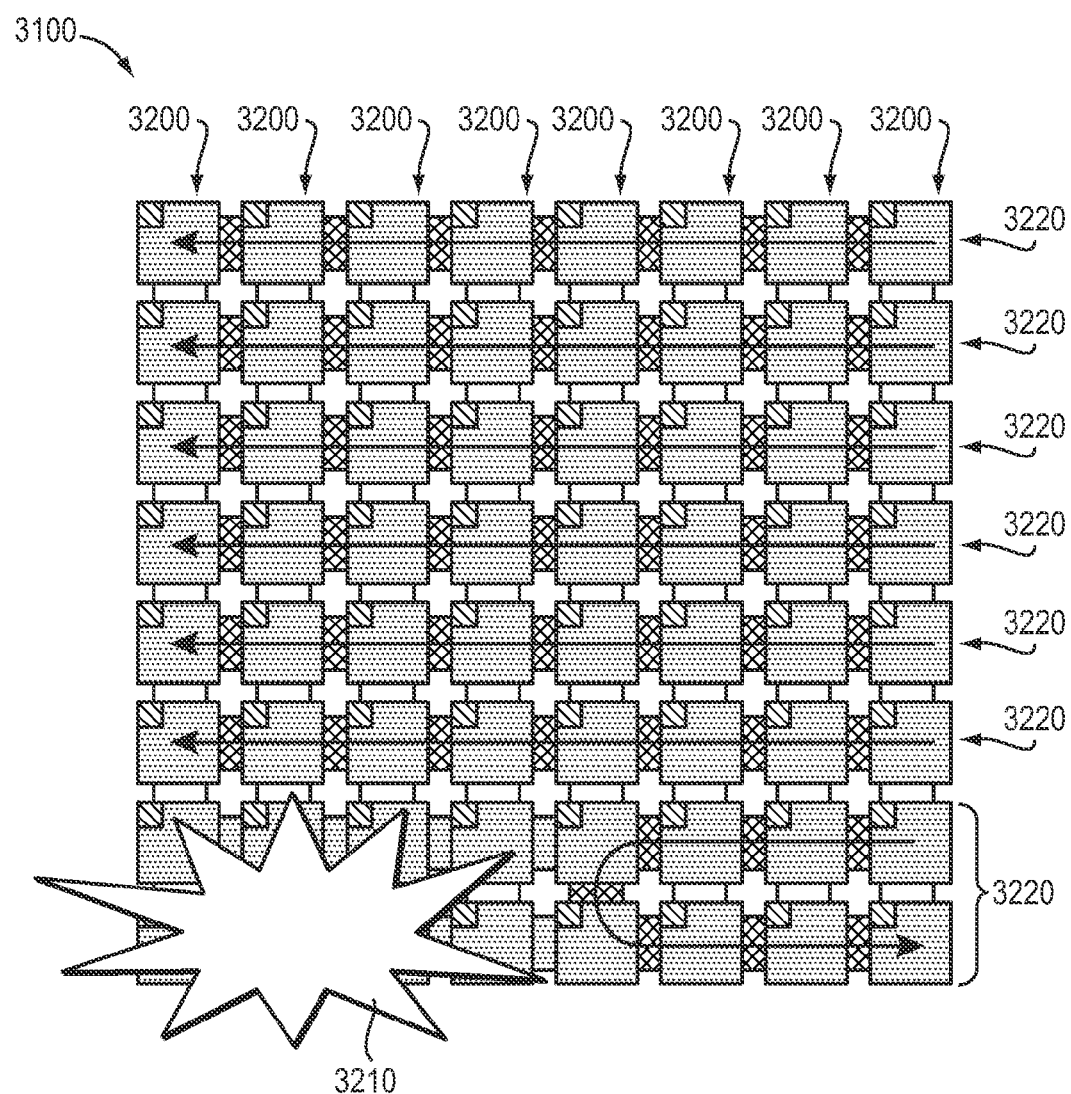
FIG. 32 is a schematic diagram of a fully reconfigurable solar-cell array fabricated on a common substrate reconfigured in response to inoperability of several of the solar unit cells to maximize power output, in accordance with various embodiments of the invention.

Another embodiment of the present invention includes switching and control circuitry at every unit cell 1600 in an array 3100, as illustrated in FIG. 31. In this embodiment, a much greater number of possible array configurations is available, along with their corresponding match points. As depicted in FIG. 31, each unit cell 1600 in the array 3100 on a substrate 110 incorporates monitoring and/or control circuitry 3110 and is connected to neighboring unit cells 1600 via reconfigurable interconnect circuitry 3120 (which may include or consist essentially of, e.g., CMOS switching elements). Such an array 3100 also enables dynamic bypassing (i.e., removal from the array via electrical disconnection) of cells 1600 that stop producing current as the result of a defect or physical damage, as illustrated in FIG. 32. Eliminating a non-functioning cell from the array generally prevents it from limiting the power output of the entire string of cells to which it is connected. For example, assuming an original configuration had series-connected strings of cells 1600 oriented in columns 3200 of the array 3100, then the damage 3210 to eight unit cells 1600 would have caused power loss from four complete column-oriented strings, or 50% total power loss from the array 3100. However, embodiments of the present invention enable reconfiguration of the array 3100 as illustrated in FIG. 32, in which the undamaged unit cells 1600 are rearranged into seven complete series-connected strings 3220 of eight cells 1600 each, and the only power loss is from the eight damaged cells 1600 (i.e., only approximately 12.5% of the power from the array 3100). In the embodiments illustrated in FIGS. 31 and 32, the on-substrate monolithically integrated control electronics may include or consist essentially of a microcontroller (or other processor) that monitors the performance (e.g., power output) of the array 3100 and dynamically adjusts the configuration of the unit cells 1600 to deliver maximum power to the load.

The efficiency of the embodiments illustrated in FIGS. 31 and 32 may be limited by the cumulative number of possible array configurations. The operating point of the array 3100 is generally discretized by the number of available configurations, but with the added benefit of eliminating passive charge-storage elements and any losses associated therewith. However, increasing the number of possible configurations may involve additional wiring complexity and/or losses associated with the active switching elements. Also, when reconfiguring unit cells into new configurations to remove inactive cells, some intact cells may well be left unutilized since, in most embodiments, series strings of unit cells will all incorporate the same number of unit cells. This loss may depend on the particular design requirements but is generally expected to be small. For example, in an array 3100 with a 50×50 arrangement of unit cells 1600, the maximum number of unused cells 1600 is only 1.6% of the total. This percentage drops with a greater number of unit cells 1600 within the array 3100.

As described in the '078 and '089 applications, the on-substrate solar-cell arrays (and/or systems incorporating multiple such arrays electrically connected together, e.g., in parallel) described herein may be advantageously utilized in a variety of applications and configurations. For example, the arrays may be utilized in concentrator systems (that incorporate, e.g., one or more lenses and a focusing system), as well as on constructs such as satellites and aerial vehicles.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming a solar-cell array with integrated bypass diodes, the method comprising:
   providing a structure comprising:
      a semiconductor substrate,
      disposed over the substrate, a first cell comprising a SiGe p-n junction or SiGe p-i-n junction, and
      disposed over the first cell, one or more second cells each comprising a III-V-semiconductor p-n junction or III-V-semiconductor p-i-n junction;
   forming over a top surface of the substrate a plurality of discrete solar cells at least in part by removing portions of the first cell and the one or more second cells to form the discrete solar cells and regions therebetween that do not produce electrical current under solar illumination, each of the discrete solar cells being a multi junction solar cell incorporating, in series, an unremoved portion of the first cell and an unremoved portion of the one or more second cells;
   forming, associated with each of the discrete solar cells, a bypass diode that (i) is discrete and laterally separate from its associated solar cell and (ii) comprises an unremoved portion of the first cell, the formation comprising removing an unremoved portion of the one or more second cells thereover;
   electrically connecting each bypass diode with its associated discrete solar cell such that the bypass diode and the discrete solar cell have opposite polarities; and
   electrically connecting, on the substrate, a plurality of the discrete solar cells in series, thereby forming a series string of discrete solar cells for supplying, under solar illumination, a voltage larger than a voltage produced by any of the discrete solar cells individually.

2. The method of claim 1, wherein the structure comprises an isolation diode disposed beneath the first cell, the isolation diode comprising a p-n junction or a p-i-n junction having a polarity opposite a polarity of the first cell.

3. The method of claim 2, wherein the isolation diode comprises SiGe having a bandgap smaller than a bandgap of the first cell.

4. The method of claim 2, wherein the structure comprises a graded-composition layer disposed beneath the first cell, the graded-composition layer relieving at least a portion of a lattice-mismatch strain between the substrate and the first cell.

5. The method of claim 4, wherein (i) a first portion of the graded-composition layer comprises SiGe and is disposed between the substrate and the isolation diode and (ii) a second portion of the graded-composition layer comprises SiGe and is disposed between the isolation diode and the first cell, the first portion grading from an initial Ge content to an intermediate Ge content larger than the initial Ge content and the second portion grading from approximately the intermediate Ge content to a final Ge content larger than the intermediate Ge content.

6. The method of claim 5, wherein the structure comprises a constant-composition SiGe layer disposed between the first and second portions of the graded-composition layer, the constant-composition layer having a Ge content approximately equal to the intermediate Ge content.

7. The method of claim 1, wherein the structure comprises a silicon cap layer disposed over the one or more second cells.

8. The method of claim 7, wherein forming the plurality of discrete solar cells comprises, for each solar cell, forming a first contact to the cap layer and forming a second contact to a layer disposed beneath the first cell, each of the first and second contacts being formed over the top surface of the substrate.

9. The method of claim 8, wherein forming the first and second contacts comprises substantially simultaneously reacting a metal with a portion of the cap layer and a portion of the layer disposed beneath the first cell, the first contact comprising a silicide of the metal and the second contact comprising a germanosilicide of the metal.

10. The method of claim 1, wherein forming the bypass diodes comprises, for each bypass diode, forming a first contact to a top surface of the first cell and a second contact to a layer disposed beneath the first cell, each of the first and second contacts being formed over the top surface of the substrate.

11. The method of claim 10, wherein forming the first and second contacts comprises substantially simultaneously reacting a metal with a portion of the first cell and a portion of the layer disposed beneath the first cell, each of the first and second contacts comprising a germanosilicide of the metal.

12. The method of claim 10, wherein the first contact covers substantially all of a top surface of the first cell of the bypass diode, thereby substantially preventing solar illumination thereof.

13. The method of claim 1, further comprising:
   forming at least one additional series string of discrete solar cells on the substrate; and
   electrically connecting the series string and the at least one additional series string in parallel.

14. The method of claim 1, wherein forming the series string comprises forming interconnection circuitry on the substrate between each of the plurality of discrete solar cells.

15. The method of claim 14, wherein the interconnection circuitry between at least two of the discrete solar cells comprises a switching element enabling reconfiguration of the electrical connection between the at least two discrete solar cells.

16. The method of claim 14, wherein the interconnection circuitry between each of the discrete solar cells comprises a switching element enabling reconfiguration of all of the electrical connections between the discrete solar cells.

17. The method of claim 1, further comprising forming over the top surface of the substrate and electrically connecting to the series string, circuitry for maximum power-point tracking, the circuitry comprising a DC/DC converter.

18. The method of claim 17, further comprising electrically connecting the circuitry to a charge-storage element not disposed over the top surface of the substrate.

19. The method of claim 18, wherein the charge-storage element is disposed under a bottom surface of the substrate opposite the top surface.

* * * * *